(12) United States Patent
Galor Gluskin

(10) Patent No.: US 10,128,284 B2
(45) Date of Patent: Nov. 13, 2018

(54) MULTI DIODE APERTURE SIMULATION

(71) Applicant: QUALCOMM Incorporated, San Diego, CA (US)

(72) Inventor: Micha Galor Gluskin, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/191,430

(22) Filed: Jun. 23, 2016

(65) Prior Publication Data

US 2017/0373105 A1 Dec. 28, 2017

(51) Int. Cl.
| | |
|---|---|
| *H04N 5/369* | (2011.01) |
| *H04N 5/3745* | (2011.01) |
| *H01L 27/146* | (2006.01) |
| *H04N 5/225* | (2006.01) |
| *H04N 5/232* | (2006.01) |
| *H04N 5/355* | (2011.01) |
| *H04N 5/378* | (2011.01) |
| *H04N 9/04* | (2006.01) |

(52) U.S. Cl.
CPC .. *H01L 27/14605* (2013.01); *H01L 27/14603* (2013.01); *H01L 27/14607* (2013.01); *H01L 27/14627* (2013.01); *H01L 27/14641* (2013.01); *H04N 5/3696* (2013.01); *H04N 5/37457* (2013.01); *H01L 27/14621* (2013.01); *H01L 27/14625* (2013.01); *H04N 5/2254* (2013.01); *H04N 5/23212* (2013.01); *H04N 5/35563* (2013.01); *H04N 5/378* (2013.01); *H04N 9/045* (2013.01)

(58) Field of Classification Search
None
See application file for complete search history.

(56) References Cited

U.S. PATENT DOCUMENTS

| | | |
|---|---|---|
| 8,629,868 B1 | 1/2014 | Gardiner et al. |
| 2008/0135757 A1 | 6/2008 | D'Souza et al. |
| (Continued) | | |

FOREIGN PATENT DOCUMENTS

| | | |
|---|---|---|
| CN | 104241310 A | 12/2014 |
| EP | 2009911 A2 | 12/2008 |
| JP | 2015115329 A | 6/2015 |

OTHER PUBLICATIONS

International Search Report and Written Opinion—PCT/US2017/029877—ISA/EPO—dated Jul. 19, 2017.

*Primary Examiner* — Justin P. Misleh
(74) *Attorney, Agent, or Firm* — Knobbe, Martens, Olson & Bear LLP

(57) ABSTRACT

Provided are techniques for simulating a aperture in a digital imaging device, the aperture simulation generated by a multi-diode pixel image sensor. In one aspect, a method includes detecting light incident on a first light sensitive region on a first photodiode of a pixel, and detecting light incident on a second light sensitive region on a second photodiode of the pixel. The method further includes combining, for each pixel, signals from the first and second light sensitive regions, and generating, for a first aperture setting, a first image based at least in part on the light received from the first light sensitive region, and generating, for a second aperture setting, a second image based at least in part on the light received from the second light sensitive region.

30 Claims, 10 Drawing Sheets

(56) References Cited

U.S. PATENT DOCUMENTS

| | | | |
|---|---|---|---|
| 2009/0090841 A1* | 4/2009 | Kusaka | G01C 3/08 |
| | | | 250/201.2 |
| 2011/0242331 A1 | 10/2011 | Cieslinski | |
| 2012/0300104 A1 | 11/2012 | Onuki et al. | |
| 2013/0258097 A1 | 10/2013 | Yamada | |
| 2014/0168482 A1 | 6/2014 | Herman et al. | |
| 2014/0267850 A1 | 9/2014 | Li et al. | |
| 2014/0354781 A1* | 12/2014 | Matsuyama | H04N 5/23212 |
| | | | 348/49 |
| 2015/0015773 A1 | 1/2015 | Tulyakov et al. | |
| 2015/0054992 A1 | 2/2015 | Luo et al. | |
| 2015/0076322 A1* | 3/2015 | Pang | H01L 27/14645 |
| | | | 250/208.1 |
| 2015/0198522 A1 | 7/2015 | Wei et al. | |
| 2015/0228687 A1 | 8/2015 | Numata | |
| 2016/0182792 A1* | 6/2016 | Aoki | G03B 9/02 |
| | | | 348/364 |
| 2016/0360134 A1* | 12/2016 | Miyake | H01L 27/14603 |
| 2017/0133420 A1* | 5/2017 | Silsby | H01L 27/14621 |

* cited by examiner

MULTI DIODE APERTURE SIMULATION

TECHNICAL FIELD

The systems and methods disclosed herein are directed to aperture simulation, and more particularly, to simulating aperture control using a multi-diode pixel design.

BACKGROUND

In photography, controlling the light amount is accomplished using a variable opening (or aperture) by which light enters a camera and a shutter time. However, this requires a camera instrument with additional mechanical properties that allow a user to adjust the variable opening from a lens or another part of the camera. Aperture size affects to the depth-of-field (DOF). Small aperture settings (e.g., high f-number, such as f/22) may increase the sharpness of distant objects, or in other words increases DOF, which means more elements of a picture, from foreground to background, become sharply focused. It is well known that small apertures are also used for landscape photographs. A larger aperture may create a bokeh effect when a photograph is taken. This can create a distinct sense of depth to a photograph, drawing the viewer into the picture. When the camera is focused on a point in a scene using a larger aperture, parts of the scene that are not within the focus may look extremely blurry relative to the object in focus.

While mobile cameras, such as digital cameras and mobile phone cameras have become more popular, due to size and cost concerns, mobile cameras typically do not feature a variable aperture.

SUMMARY

The systems, methods, devices, and computer program products discussed herein each have several aspects, no single one of which is solely responsible for its desirable attributes. Without limiting the scope of this invention as expressed by the claims which follow, some features are discussed briefly below. After considering this discussion, and particularly after reading the section entitled "Detailed Description," it will be understood how advantageous features of this invention include aperture simulation using multi-diode pixel elements.

In one aspect, there is provided a device for aperture simulation, comprising an array of pixels, each pixel comprising a first photodiode comprising a first light sensitive region configured to detect light incident on the first light sensitive region and a second photodiode comprising a second light sensitive region and configured to detect light incident on the second light sensitive region, wherein the first light sensitive region is at least partially surrounded by the second light sensitive region; a signal mixer coupled to each pixel and configured to combine, for each pixel, signals from the first and second photodiodes in response to light incident on the first and second light sensitive regions, the signals indicative of a first light energy incident on the first light sensitive region and a second light energy incident on the second light sensitive region; and at least one logic circuit (e.g., processor(s), adder(s), multiplier(s), and/or the like) coupled to the signal mixer and configured to simulate aperture control based on: (i) generating, for a first aperture simulation setting, a first image based at least in part on the first light energy incident on the first light sensitive region; and (ii) generating, for a second aperture simulation setting, a second image based at least in part on the second light energy incident on the second light sensitive region.

The following are non-limiting examples of some features and embodiments of such aperture simulation devices. For example, an aperture simulation device may include a second light sensitive region that is larger than the first light sensitive region. In some examples, at least one logic circuit is configured generate the second image based on a combination of the first light energy incident on the first light sensitive region and the second light energy incident on the second light sensitive region.

The aperture simulation device may include a third photodiode, the third photodiode comprising a third light sensitive region configured to detect light incident on the third light sensitive region, wherein the first light sensitive region is at least partially surrounded by the third light sensitive region, wherein the signal mixer is further configured to combine signals from the first, second, and third photodiodes, signals from the first, second, and third photodiodes in response to light incident on the first, second, and third light sensitive regions on each pixel, and wherein the logic circuit is further configured to generate a third image based at least in part on the third light energy incident on the third light sensitive region. The third light sensitive region may be larger than the first light sensitive region.

The aperture simulation device may include at least one logic circuit configured generate the third image based on a combination of the first light energy incident on the first light sensitive region, the second light energy incident on the second light sensitive region, and the third light energy incident on the third light sensitive region.

The aperture simulation device may include a micro-lens array, the micro-lens array arranged relative to the pixel array such that each pixel receives light propagating through at least one micro-lens, where each micro-lens comprises one plane surface and one spherical convex surface, and wherein the first light sensing element is arranged relative to the micro-lens such that a center of the first light sensing element is vertically aligned with a center of the micro-lens.

In another aspect, there is provided a method of simulating an aperture with an array of image pixels, each image pixel comprising a first photodiode and a second photodiode, comprising detecting light incident on a first light sensitive region on the first photodiode, detecting light incident on a second light sensitive region on the second photodiode, wherein the first light sensitive region is at least partially surrounded by the second light sensitive region, combining, for each pixel, signals from the first and second photodiodes in response to light incident on the first and second light sensitive regions, the signals indicative of a first light energy incident on the first light sensitive region and a second light energy incident on the second light sensitive region, generating, for a first aperture simulation setting, a first image based at least in part on the first light energy incident on the first light sensitive region, and generating, for a second aperture simulation setting, a second image based at least in part on the second light energy incident on the second light sensitive region.

For some embodiments, the second light sensitive region is larger than the first light sensitive region. For some embodiments, the method of simulating an aperture may include generating the second image based on a combination of the first light energy incident on the first light sensitive region and the second light energy incident on the second light sensitive region.

For some embodiments, the method of simulating an aperture may include a third photodiode, the third photodiode comprising a third light sensitive region configured to detect light incident on the third light sensitive region, wherein the first light sensitive region is at least partially surrounded by the third light sensitive region, wherein the signal mixer is further configured to combine signals from the first, second, and third photodiodes, signals from the first, second, and third photodiodes in response to light incident on the first, second, and third light sensitive regions on each pixel, and wherein the logic circuit is further configured to generate a third image based at least in part on the third light energy incident on the third light sensitive region. For some embodiments, the third light sensitive region is larger than the first light sensitive region.

For some embodiments, the method of simulating an aperture may include generating the third image based on a combination of the first light energy incident on the first light sensitive region, the second light energy incident on the second light sensitive region, and the third light energy incident on the third light sensitive region.

For some embodiments, the method of simulating an aperture may include utilizing a micro-lens array, the micro-lens array arranged relative to the pixel array such that each pixel receives light propagating through at least one micro-lens.

In another aspect, there is provided a system for simulating an aperture with an array of image pixels, comprising means for detecting light incident on a first light sensitive region, means for detecting light incident on a second light sensitive region, wherein the first light sensitive region is at least partially surrounded by the second light sensitive region, means for combining, for each pixel, signals in response to light incident on the first and second light sensitive regions, the signals indicative of a first light energy incident on the first light sensitive region and a second light energy incident on the second light sensitive region, means for generating, for a first aperture simulation setting, a first image based at least in part on the first light energy incident on the first light sensitive region, and means for generating, for a second aperture simulation setting, a second image based at least in part on the second light energy incident on the second light sensitive region.

For some embodiments, the means for detecting light incident on a first light sensitive region is a first photodiode, the means for detecting light incident on a second light sensitive region is a second photodiode, the means for combining signals in response to light incident on the first and second light sensitive regions is an analog signal mixer, and the means for generating the first image and the second image is a logic circuit.

For some embodiments, the second light sensitive region is larger than the first light sensitive region. For some embodiments, generating the second image is based on a combination of the first light energy incident on the first light sensitive region and the second light energy incident on the second light sensitive region.

For some embodiments, the apparatus includes means for detecting light incident on a third light sensitive region, wherein the first light sensitive region is at least partially surrounded by the third light sensitive region, wherein the means for combining is further configured to combine signals from the first, second, and third light sensitive regions, signals from the first, second, and third light sensitive in response to light incident on the first, second, and third light sensitive regions on each pixel, and wherein the means for generating the first image and the second image is further configured to generate a third image based at least in part on the third light energy incident on the third light sensitive region. For some embodiments, the third light sensitive region is larger than the first light sensitive region. For some embodiments, the apparatus includes generating the third image based on a combination of the first light energy incident on the first light sensitive region, the second light energy incident on the second light sensitive region, and the third light energy incident on the third light sensitive region.

In another aspect, there is provided a non-transitory, computer readable storage medium comprising instructions executable by a logic circuit of an apparatus, that causes the apparatus to detect light incident on a first light sensitive region on the first photodiode, detect light incident on a second light sensitive region on the second photodiode, wherein the first light sensitive region is at least partially surrounded by the second light sensitive region, combine, for each pixel, signals from the first and second photodiodes in response to light incident on the first and second light sensitive regions, the signals indicative of a first light energy incident on the first light sensitive region and a second light energy incident on the second light sensitive region, generate, for a first aperture simulation setting, a first image based at least in part on the first light energy incident on the first light sensitive region, and generate, for a second aperture simulation setting, a second image based at least in part on the second light energy incident on the second light sensitive region.

For some embodiments, the second light sensitive region is larger than the first light sensitive region. For some embodiments, the non-transitory, computer readable storage medium may include instructions that cause the apparatus to generate the second image based on a combination of the first light energy incident on the first light sensitive region and the second light energy incident on the second light sensitive region. For some embodiments, the non-transitory, computer readable storage medium may include instructions that cause the apparatus to detect light incident on a third photodiode comprising a third light sensitive region, wherein the first light sensitive region is at least partially surrounded by the third light sensitive region, wherein the signal mixer is further configured to combine signals from the first, second, and third photodiodes, signals from the first, second, and third photodiodes in response to light incident on the first, second, and third light sensitive regions on each pixel, and generate a third image based at least in part on the third light energy incident on the third light sensitive region.

In some embodiments, the third light sensitive region is larger than the first light sensitive region. In some embodiments, the non-transitory, computer readable storage medium may include instructions that cause the apparatus to generate the third image based on a combination of the first light energy incident on the first light sensitive region, the second light energy incident on the second light sensitive region, and the third light energy incident on the third light sensitive region. In some embodiments, generating the second image is based on a formula:

$$(E_s+E_b)\cdot(\alpha_0)+E_s\cdot(1-\alpha_0)$$

where $E_s$ is the first light energy incident on the first light sensitive region, $E_b$ is the second light energy incident on the second light sensitive region, and $\alpha_0$ is a first configurable register value being between zero and one.

In some embodiments, generating the third image is based on a formula:

$$(E_s)\cdot(a_0)+(E_s+E_m)\cdot(a_1)+(E_s+E_m+E_b)\cdot(a_2)$$

where $E_s$ is the first light energy incident on the first light sensitive region, $E_b$ is the second light energy incident on the second light sensitive region, $E_m$ is the third light energy incident on the third light sensitive region, and $a_0$ is a first configurable register value being between zero and one, $a_1$ is a second configurable register value being between zero and one, and $a_2$ is a third configurable register value between zero and one.

DETAILED DESCRIPTION

Figure 1:
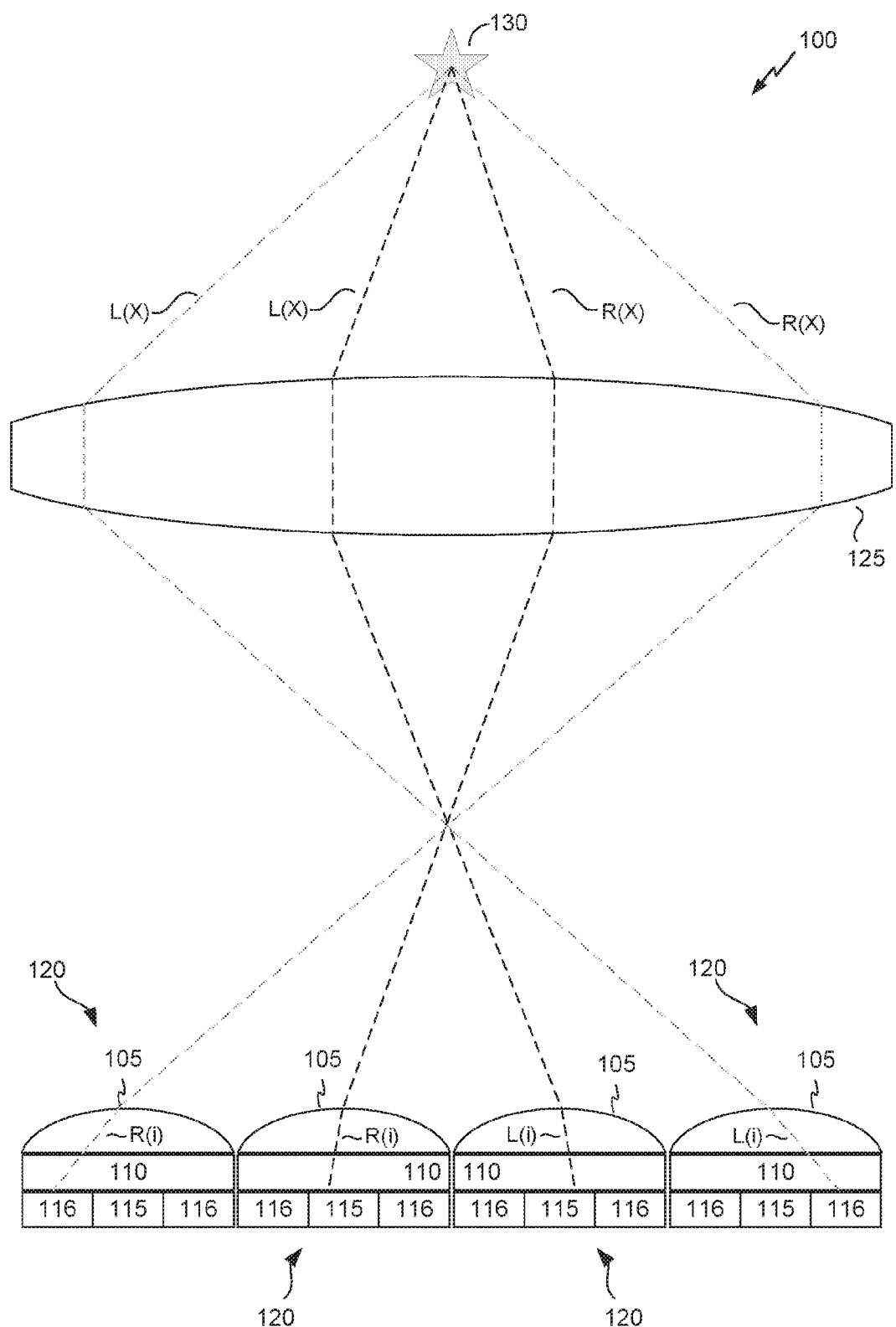
FIG. 1 illustrates an example ray trace of light entering a camera lens and being directed to a plurality of multi-diode pixels in an image pixel.

The size of the camera can be reduced by reducing the size of the camera components, or eliminating one or more of the components. For example, aperture construction (sometimes combination of shutter and aperture, namely diaphragm shutter) may be altogether eliminated to create a compact digital camera that is easily integrated with other devices. While some compact mobile devices include a digital camera with an aperture, reducing the aperture to fit a compact implementation often results in challenges. First, compact aperture construction is very complex whereupon there is a risk to break down or jam. Secondly the shape of the prior art aperture is not fully circular, which can affect distortions into the picture. In addition, weight and size of the aperture is not easily reduced by conventional manners. The additional elements required for an aperture on a camera may increase the thickness of the camera. Furthermore the manufacturing of the compact aperture implementation may be complex and time consuming because of the complexity of the aperture structure.

Accordingly, aperture simulation would reduce costs and free up space in implementations such as camera phones, while still allowing for manual and automatic aperture adjustment. Thus, it may be desired to simulate an aperture in digital image pixels in order to capture images that include a high DOF, but that may also include, for example, a Bokeh effect or the like.

The following detailed description is directed to certain specific embodiments of the invention. However, the invention may be embodied in a multitude of different ways. It should be apparent that the aspects herein may be embodied in a wide variety of forms and that any specific structure, function, or both being disclosed herein is merely representative. Based on the teachings herein one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to, or other than one or more of the aspects set forth herein.

The examples, systems, and methods described herein are described with respect to digital camera technologies. The systems and methods described herein may be implemented on a variety of different photosensitive devices, or image pixels. These include general purpose or special purpose image pixels, environments, or configurations. Examples of photosensitive devices, environments, and configurations that may be suitable for use with the invention include, but are not limited to, semiconductor charge-coupled devices (CCDs) or active pixel sensors in complementary metal-oxide-semiconductor (CMOS) or N-Type metal-oxide-semiconductor (NMOS) technologies, all of which can be germane in a variety of applications including: digital cameras, hand-held or laptop devices, and mobile devices (e.g., phones, smart phones, Personal Data Assistants (PDAs), Ultra Mobile Personal Computers (UMPCs), and Mobile Internet Devices (MIDs)).

System Overview

FIG. 1 depicts an example ray trace 100 of an in-focus condition. Light travels from the point of focus in a target scene 130, travels through a lens 125 for focusing the target scene 130 onto an image sensor (e.g., as represented by the illustrated array of pixel 120 elements) before falling incident the small photodiode 115 and the large photodiode 116 of each pixel 120. As described herein, the pixel 120 elements and/or the array of pixel 120 elements may also be referred to individually as "pixel," collectively as "pixels," "array of pixels," "multiple pixels," "image sensor array," etc., and individually or collectively as all or part of the image sensor. A digital camera may include additional lens elements. FIG. 1 illustrates a single lens 125 element for purposes of explanation. As illustrated, pixels receive light from a left direction L(X) and a right direction R(X) of the lens 125. Each pixel may include a multi-diode micro lens (MDML) 105 overlaying the light sensitive regions of the pixel 120. In some embodiments, each MDML 105 may include between 1 and 10 microns of polymer over each pixel 120 with one plane surface and one spherical convex surface to refract the light. In another embodiment, each MDML 105 may have an aspherical shape or any other shape that is designed to focus light into the photodiodes of a pixel. An array of MDMLs 105 may be used to overlay the array of pixels to increase the light collection efficiency of the large photodiode 116 and the small photodiode 115. Specifically, the MDML 105 may collect and focus the light incident the pixel to the small photodiode 115.

Still referring to FIG. 1, the large photodiode 116 and the small photodiode 115 of the pixel 120 may be overlaid with a color filter 110 such that each pixel 120 separately detects wavelengths of light associated with different colors. For example, a pixel 120 may be designed to detect first, second, or third color (e.g., red, green, or blue wavelengths). To accomplish this, each pixel 120 in the array of pixels may be covered with a single color filter (e.g., a red, green or blue filter). The single color filters may be arranged into a pattern to form a color filter array (CFA) over the array of pixels such that each individual filter in the CFA is aligned with one individual pixel 120 in the array. Accordingly, each pixel in the array may detect the single color of light corresponding to the filter aligned with it. One example of a CFA pattern is the Bayer CFA, where the array portion consists of rows of alternating red and green color filters and alternating blue and green color filters. Each color filter corresponds to one pixel 120 in an underlying pixel array. In a Bayer CFA, half of the color filters are green color filters, one quarter of the color filters are blue color filters, and one quarter of the color filters are red color filters. The use of twice as many green filters as red and blue filters, respectively, imitates the human eye's greater ability to see green light than red and blue light. Each pixel in the Bayer CFA is sensitive to a different color of light than its closest neighbors. For example, the nearest neighbors to each green filter are red and blue filters, the nearest neighbors to each red filter are green filters, and the nearest neighbor to each blue filter are green filters. Because each filter's closest neighbors have different color designations than it, each filter overlies only one corresponding pixel. Color filter material consists of dyes, or more commonly pigments, to define the spectrum of the color filter 110. The size of each color filter may correspond to the size of the pixel, for example, a 1:1 ratio. However, in another embodiment, each color filter 110 may be larger or smaller than the corresponding pixel 120. For example, in the ratio of color filter 110 to pixel 120 size, the color filter 110 size may be represented by any integer or decimal number. In this embodiment, each pixel of the image sensor may include multiple color filter 110 elements, where each color filter element 110 of the multiple color filter elements overlie a photodiode. In this configuration, the color filter elements may include patterns of colors similar to those discussed in further detail below with reference to FIGS. 8A-8D.

Still referring to FIG. 1, the pixel 120 may include two photosensitive diodes: a small photodiode 115 and a large photodiode 116. Pinned photodiodes may be used as an example for such light sensing elements, although it should be clear to one of skill in the art that other light sensing elements may also be used. The pixel 120 may further include other readout elements, which can work for either each photodiode separately, or both diodes may share some common readout elements. This may lead to an increased fill factor of the photodiodes. These pixels may be repeatedly instantiated in a horizontal direction, with a fixed pixel pitch, in order to form one row of pixels. Each imager may include a number of rows or such pixels, with substantially the same pixel pitch in a vertical direction as in the horizontal direction, in order to form a two-dimensional pixel array 200. In one embodiment, the large photodiode 116 may substantially surround the small photodiode 115 at least partially. The surface area of the small photodiode 115 may be such that it is fraction of the size of the large photodiode 116. The term "substantially" as used here indicates a tolerance within 10% of the measurement or position expressed.

Figure 2:
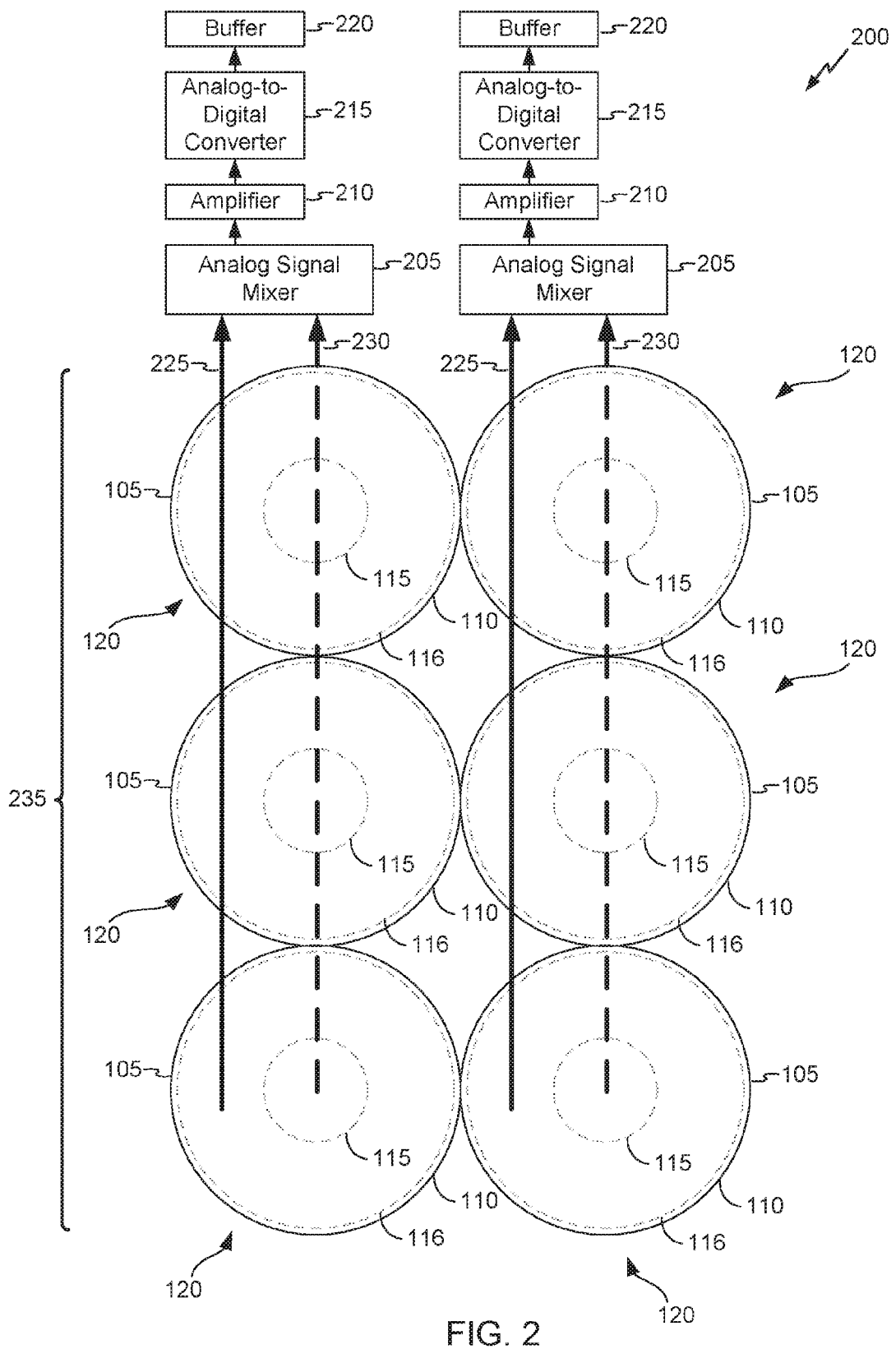
FIG. 2 illustrates an example set of columns of multi-diode pixels and the set of circuitry for each column.

FIG. 2 illustrates two example columns of pixels 120, where each column includes circuitry for reading and adjusting the analog signals 225, 230 from the large photodiode 116 and the small photodiode 115, respectively. As described above in connection with FIG. 1, the pixels 120 may also be referred to as part of the image sensor. The image sensor may also include one or more sets of image sensor circuitry (or "circuitry" or "sets of circuitry"). For example, circuitry may receive the analog signals from each pixel of the column in succession. In an alternative embodiment, the pixels 120 may be read by row, with circuitry for combining the analog signals at each row. In both of these embodiments, pixels from each row can be read simultaneously resulting in a faster processing of the digital image. In another alternative embodiment, the image sensor may include one or more sets of circuitry for receiving and adjusting the analog signals 225, 230, where, in the case of one set of circuitry, each pixel 120 is read in succession.

Still referring to FIG. 2, the circuitry may include an analog signal mixer 205 for receiving the analog signals 225, 230 produced by each pixel 120. The analog mixer may include a nonlinear electrical circuit that creates and outputs one or more new frequencies from one or both of the analog signals 225, 230 received by it. In one embodiment, the analog signal mixer 205 receives both of the analog signals 225, 230 as input signals and outputs a signal that is the summation of the two analog signals 225, 230. The signal mixer 205 may multiply a number of the received analog signals by a factor and perform additional summation steps of the resulting signals. For example, the signal mixer may generate a summation of the two input analog signals 225, 230 and multiply the resulting signal by a factor between 0 and 1.

Still referring to FIG. 2, the circuitry may also include a charge transfer amplifier 210 coupled to receive the analog signal output generated by the analog signal mixer 205. The amplifier 210 may amplify the analog signal output to generate an amplified pixel voltage signal to increase the strength of the pixel analog signal 225, 230 values (e.g., the voltage or current). The charge transfer amplifier 210 generates a pixel voltage signal having an increased voltage magnitude than the voltage signal generated by the small photodiode 115 and the large photodiode 116 of each pixel and provides the enhanced voltage value to the analog-to-digital conversion circuit (ADC) 215. The integration of a charge transfer amplifier in a pixel 120 may have the effect of increasing the sensitivity level of each of the pixels 120 and as a result, provides a digital image sensor with increased sensitivity and dynamic range. The operation of the charge transfer amplifier may be controlled by a control signal generated by analog signal mixer 205. The control signal may also be a common signal driving a column or a row 235 of pixels in the image sensor array of pixels 200, or a common driving signal driving the pixels 120 in the entire array of pixels 200.

Still referring to FIG. 2, the ADC 215 may be coupled to the output of the amplifier 210. The ADC 215 may be shared among a row or column 235 of pixels. The amplified pixel 120 values may be converted into digital signals to be read and processed by digital circuits, since digital circuits can offer advantages compared to analog circuits with respect to processing speed and efficient transmission of information. Each ADC 215 may perform analog-to-digital conversion of the amplifier's 210 output voltage signal to yield a digitized pixel 120 voltage signal indicative of the amount of light exposure of each of the small photodiode 115 and the large photodiode 116 in each pixel 120. The ADC 215 can be implemented using any known A/D conversion technique and can have any degree of accuracy (e.g. 8, 10 or 16 bits or more). The ADC 215 may be controlled by a clock (CLK) signal and digitizes the analog pixel voltage signal when triggered by the CLK signal. The image sensor may include other control circuitry such as a clock generation circuit and other global control circuitry which are not shown in FIG. 2. The ADC circuit may output the digitized analog pixel voltage signal to a buffer 220. The buffer can temporarily store the digital data from the ADC 215 before it provides the data to a logic circuit. The logic circuit may include, for example, one or more of a processor, an application specific integrated circuit (ASIC), and/or an image signal processor (ISP). The logic circuit may include, for example, an adder circuit or a multiplier circuit, or both, or component(s) thereof, wherein the adder circuit and/or the multiplier circuit may function in the digital or analog domain, or both.

In one aspect, the pixel array 200, analog signal mixer 205, and amplifier 210 together may perform functions including: (1) photon to charge conversion; (2) accumulation of image charge; (3) signal mixing of charge accompanied by amplification of the mixed signal; (4) conversion of the amplified mixed signal to a digital signal; and (5) storage in a buffer of the digital signal representing a pixel 120 charge.

In another aspect, the analog signals 225, 230 from the large photodiode 116 and the small photodiode 115, respectively, may be converted from an analog signal to a digital signal separately, or without utilization of the analog signal mixer 205. In such a configuration, the digital signals of both the large photodiode 16 and the small photodiode 115 are mixed after digitization of the respective analog signals by the ISP or a system associated with the processor (SoC).

Example Pixel Architectures

Figure 3A:
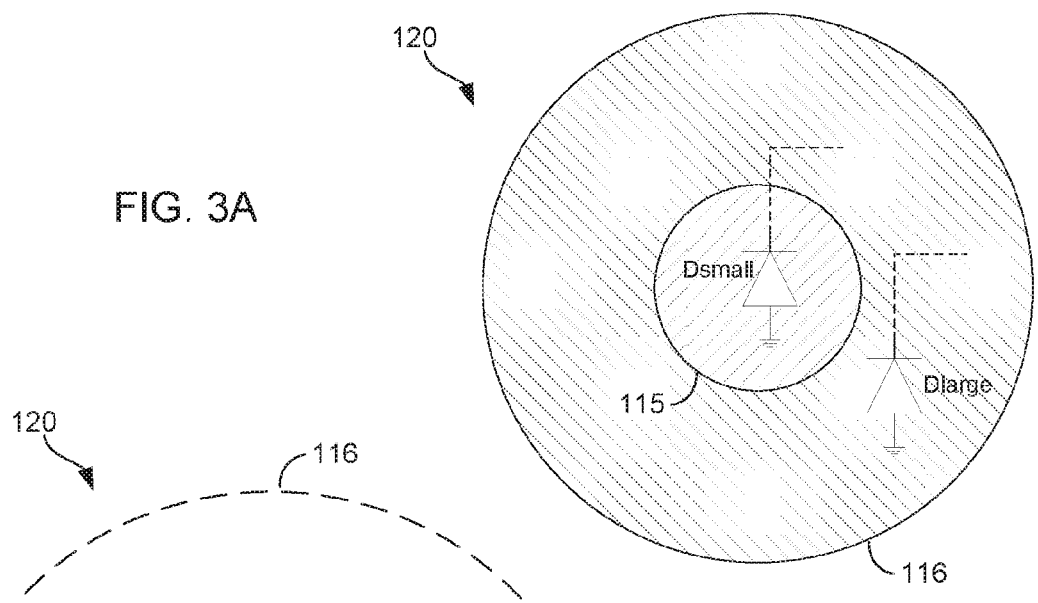
FIGS. 3A-3C illustrate exemplary schematic diagrams of two diode pixels.

FIG. 3A illustrates an example pixel 120 including different sized light sensing elements. FIG. 3A is an example only, and should not be used to represent a correct scale. Image sensors using such pixels 120 can simulate an aperture by using the arrangement of different sensing elements, as discussed below. One method which may be used to provide increased dynamic range is to provide a pixel with two light sensing elements per pixel, a centrally located small photodiode 115, and large photodiode 116 surrounding the small photodiode 115 at least partially. In this diagram of the pixel 120, the large photodiode 116 may be referred to as Dlarge, while the small photodiode 115 may be referred to as Dsmall. The pixel 120 may further include other readout elements, which can work for either each photodiode separately, or both diodes may share some common readout elements. This may lead to an increased fill factor of the photodiodes. These pixels may be repeatedly instantiated in a horizontal direction, with a fixed pixel pitch, in order to form one row of pixels.

Image sensors that include pixels with different sensing elements, such as pixel 120, may differ from prior image sensors in a number of ways. For example, the large photodiode 116 and the small photodiode 115 of the visible image sensor may have different integration times. For example, the larger photodiode 116 may have a longer integration time than the small photodiode 115, and vis-a-versa. In another example, both the large photodiode 116 and the small photodiode 115 may have substantially the same integration times, or may be user configurable. The term "substantially" as used here indicates a tolerance within 10% of the measurement expressed.

Figure 3B:
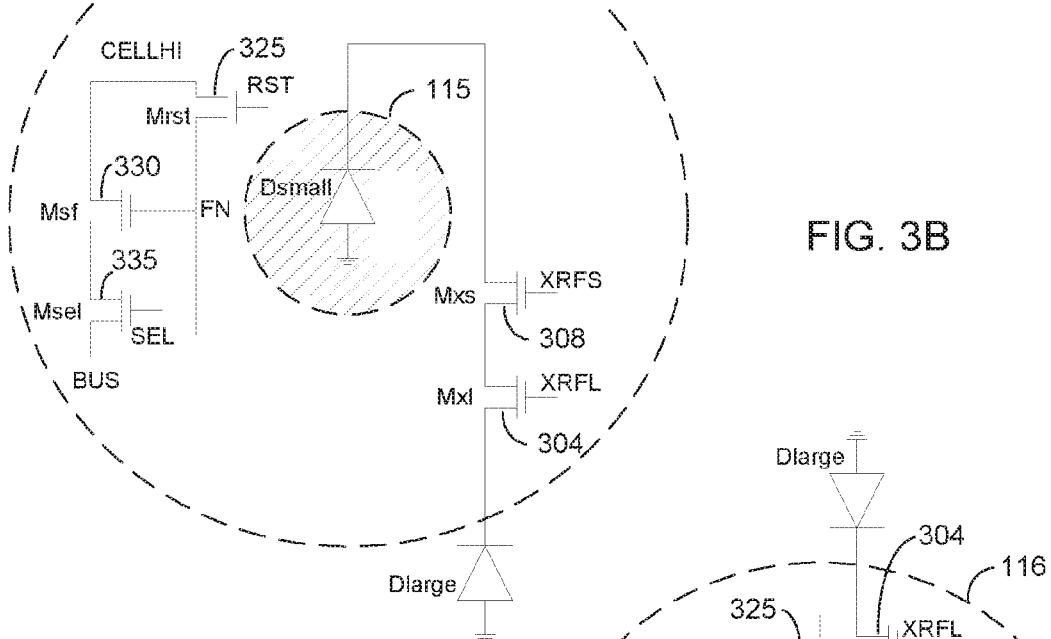

FIG. 3B illustrates an example circuit based on a low-noise 4-transistor (4T) pixel, and may include separate transfer gates, mixer large (Mxl) 304 and mixer small (Mxs) 308, for the large photodiode 116 and small photodiode 115, Dlarge and Dsmall, respectively. As illustrated by the dotted line for the large photodiode 116, Dlarge, and the shaded region of the small photodiode 115, Dsmall, the diodes may have different sizes, with a larger size for the large photodiode 116, Dlarge. While a circular shape is illustrated for the large photodiode 116, in some aspects, it may be preferable to have a more well-controlled shape for each diode, such as a rounded rectangular shape in order to facilitate charge transfer. Other circuits supporting the pixel may include a reset transistor, master reset (Mrst) 325, and a readout branch, consisting of a source follower transistor, master source follower (Msf) 330, and a row select transistor, master selector (Msel) 335.

Still referring to FIG. 3B, in this type of pixel 120, incoming photons are converted to electron and hole pairs in a silicon substrate. The photo-electrons are then collected by the two photodiodes, Dlarge and Dsmall. The integration time for either the large photodiode 116, Dlarge or the small photodiode 115, Dsmall, or both, may begin at a time $T_0$. At this time, reset (RST), transfer field large (XRFL), and transfer field small (XRFS) may be high for an amount of time, turning on transistors Mrst 325, Mxs 308, and Mxl 304. This may empty all electrons in the photodiodes 115, 116 and may set them to a predetermined voltage. Once XRFL and XRFS are set to a low voltage, Mxs 308 and Mxl 304 turn off, and the photodiodes begin collecting photo-electrons and voltage decreases. In general, the rate of such photo-electron accumulation is proportional to the amount of incoming light shining on the large photodiode 116 and the small photodiode 115 and therefore is a function of both light intensity and photodiode area.

As mentioned above, the large photodiode 116 may be configured to collect light for a defined period of time. Simultaneously with the large photodiode 116 collecting electrons, the small photodiode 115 may also collect electrons, but these may not be used. The small photodiode 115, Dsmall, may be reset by setting both RST and XRFS to a high value. This reset may discard any photoelectrons that Dsmall has collected, and may instruct Dsmall to begin collecting photoelectrons again.

In addition, Dsmall may be configured to collect light for a period of time. Simultaneously with Dsmall collecting electrons, Dlarge may also collect electrons, but these may not be used. The large photodiode 116, Dlarge, may be reset by setting both RST and XRFL to a high value. This reset may discard any photoelectrons that Dlarge has collected, and instruct Dlarge to begin collecting photoelectrons again.

At the end of the integration time, a correlated double sampling (CDS) operation may be employed to readout the accumulated charge on a diode. In order to do this, first transistor Mrst 325 is turn on by setting RST high, which sets the floating node (FN) to a reset voltage (CELLHI bias—threshold of Mrst 325). After this, SEL signal may be set high, which may turn on Msel 335 in order to enable pixel readout. If BUS is connected to a current source, then Msf 330 acts as a source follower, resulting in BUS voltage tracking the voltage of the FN. Once the reset voltage of the FN has been readout, Mxl 304 is turned on by setting XRFL high, dumping all collected photo-electrons in Dlarge 116 to the FN, thus reducing the voltage of the FN. After this, BUS voltage may follow the reduced voltage of the FN, and a second readout may be performed through the source follower, if SEL is set high. The difference between both readouts may be used to determine an exact voltage change on node FN due to photo-electrons collected by Dlarge.

Additional column circuits may also be used in order to store such information, and in order to enable further processing, such as amplification, digitization, and other processing. In general, CDS operation may reduce the impact of transistor variation and certain temporal noises which may be present. In some aspects, the time difference between the two XRFL pulses, one for reset and one for readout, may represent the integration time of the large photodiode 116. Once the large photodiode 116, Dlarge, has been readout, another CDS operation may be carried out to readout the small photodiode 115, Dsmall. This operation may be similar to the operation described above with regards to the large photodiode 116.

In the CDS operation to readout Dsmall, Mxs 308 may be turned on by setting XFRS high for the small photodiode 115. In integrating for Dsmall, the time between the two XFRS pulses is the integration time of Dsmall. When using a readout scheme where the CDS operation is performed on the large photodiode and the small photodiode of the pixel at different time, the line buffer 220 may store the information from the large photodiode 116. Once the small photodiode 115 from the pixel is readout, it may be combined with the result from the associated large photodiode 116 in order to form a final pixel output value. Therefore, the additional memory requirement from this two-diode configuration is minimal. In another example embodiment, the CDS operation may be carried out for both the large photodiode 116 and the small photodiode 115 of a given pixel 120 simultaneously.

Figure 3C:
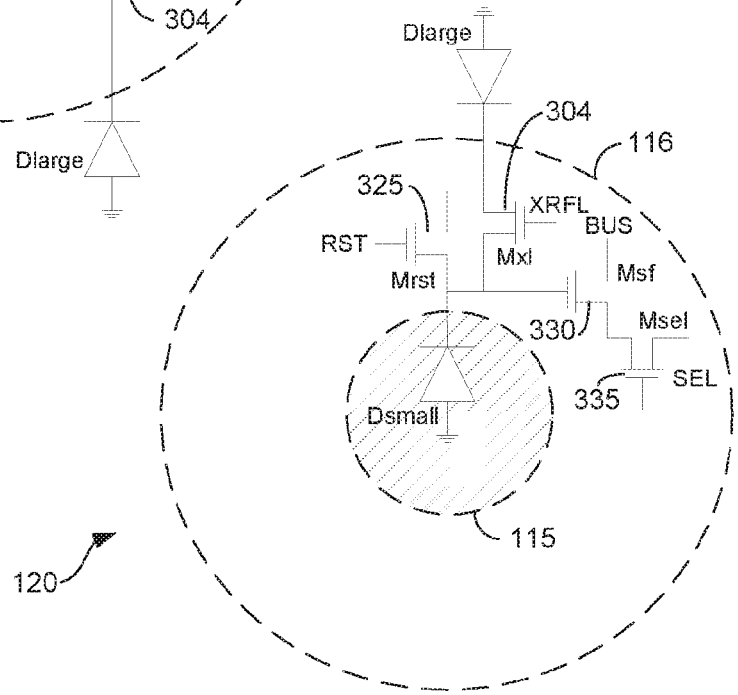

FIG. 3C illustrates an example circuit based on a low-noise 3-transistor pixel, and may include separate transfer gate, Mxl 304, for the large photodiode 116. As illustrated by the dotted line for the large photodiode 116, Dlarge, and the shaded region of the small photodiode 115, Dsmall, the diodes may have different sizes, with a larger size for Dlarge 116. Other circuits supporting the pixel may include a reset transistor, Mrst 325, and a readout branch, consisting of a source follower transistor, Msf 330, and a row select transistor, Msel 335.

Still referring to FIG. 3C, in this type of pixel 120, incoming photons are converted to electron and hole pairs in a silicon substrate. The photo-electrons are then collected by the two photodiodes, Dlarge and Dsmall. The integration time for the large photodiode 116, Dlarge, may begin at a time $T_0$. At this time, both RST and XRFL may be high for an amount of time, turning on transistors Mrst 325 and Mxl 304. This may empty all electrons in the large photodiode 116 and may set it to a predetermined voltage. Once XRFL is set to a low voltage, Mxl 304 may turn off, and the large photodiode begin collecting photo-electrons and voltage decreases. In general, the rate of such photo-electron accumulation is proportional to the amount of incoming light incident on Dlarge, and therefore is a function of both light intensity and photodiode area. Dsmall may be configured to collect light for a period of time. Simultaneously with Dsmall collecting electrons, Dlarge may also collect electrons, but these may not be used. The large photodiode 116, Dlarge, may be reset by setting both RST and XRFL to a high value. This reset may discard any photoelectrons that Dlarge has collected, and allow Dlarge to begin collecting photoelectrons again.

Additional Photodiode Arrangements

Figure 4:
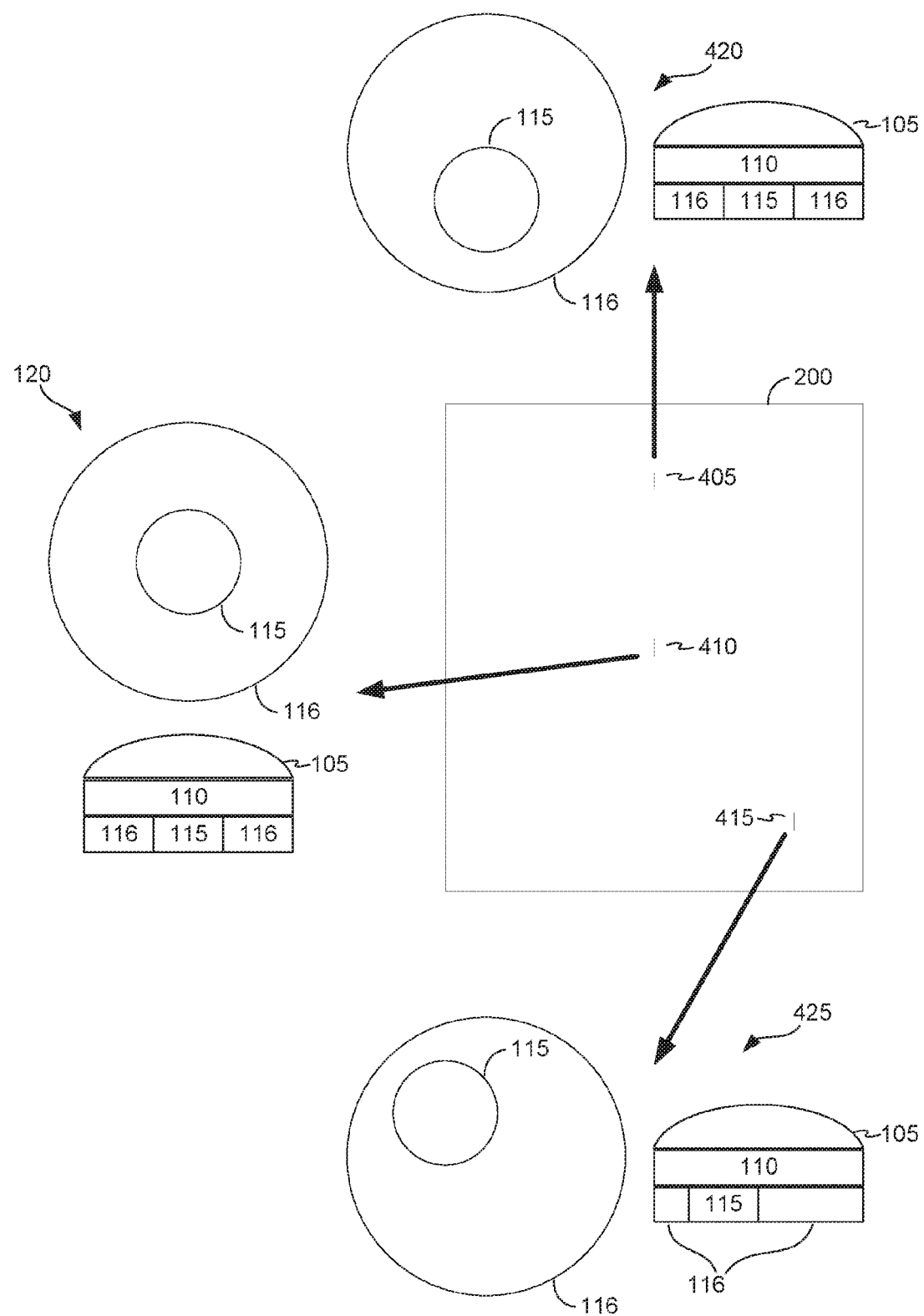
FIG. 4 illustrates a set of three example pixel positions in an image pixel array, and the corresponding diode configurations according to the pixel position.

FIG. 4 illustrates an alternative embodiment in terms of location of the small photodiode 115 in relation to the large photodiode 116 on a pixel. The array of pixels 200 may include a plurality of multi-diode pixels 120, where the small photodiode 115 location on each pixel 120 is related to its location in the array of pixels 200, such that the chief ray angle of the light incident on the array of pixels 200 is directed to the small photodiode 115. FIG. 4 illustrates an example array of pixels 200 of an image sensor shown as a square. Three cross-hatches 405, 410, 415 represent pixel locations in the array of pixels 200. The array of pixels 200 may be any CMOS, CCD, or other image sensor. In some embodiments, the image sensor can be, for example, a 32 megapixel (MP)/30 frames per second (fps) image sensor having approximately 0.5 µm pixels, each pixel 120 having multiple photodiodes and an approximate 1000 electron (–e) well capacity associated with each photodiode of the multiple photodiodes. These image sensor specifications represent just one embodiment of an image sensor, and other image sensors with varying specifications may be used in other embodiments.

The array of pixels 200 may include a plurality of pixels arranged in a predetermined number of rows and columns 235 (e.g., M rows and N columns). Each of the pixels may each include multiple photodiodes overlying a substrate for accumulating photo-generated charge in an underlying portion of the substrate. The array of pixels 200 may, in some implementations, include one or more color filters 110 positioned to filter incoming light, for example, an infrared cut-off filter or a color filter. The photodiodes of a CMOS pixel may be one of a depleted p-n junction photodiode or a field-induced depletion region beneath a photogate.

The first pixel location 410 is substantially in the center of the array of pixels 200. Each pixel 120 within the center region of the array of pixels 200 may include multiple light sensing photodiodes 115, 116. In one embodiment, each pixel 120 includes two light sensing photodiodes 115, 116 where a small photodiode 115 is substantially enclosed by a large photodiode 116, and the small photodiode 115 is located in the center of the pixel 120. There are two views of the pixel 120 in the first pixel location 410. The first view is from directly above, and illustrates the location of the small photodiode 115 in relation to the large photodiode 116. The second view is a cut-away view of the pixel 120 illustrating the relation of the small pixel to the apex of the MDML 105. In the second view, the small photodiode 115 is directly under the apex of the MDML 105. In this configuration, the chief ray angle of the light from the scene 130 is directed onto the small photodiode 115. The term "substantially" as used here indicates a tolerance within 10% of the position expressed.

Still referring to FIG. 4, a second pixel location 405 is closer to the outside boundary of the image sensor pixel array 200 and is substantially vertically aligned with the center of the array of pixels 200. There are two views of the pixel 420 in the second pixel location 405. The first view is from directly above, and illustrates the location of the small photodiode 115 in relation to the large photodiode 116. In this embodiment, the smaller photodiode 115 may still be substantially enclosed by the larger photodiode 116, and may also be positioned so that the chief ray angle of light is directed to the smaller photodiode 115. In this view the smaller photodiode 115 is closer to the bottom of the pixel 420. The second view is a cut-away view of the pixel 420 illustrating the relation of the small pixel to the apex of the MDML 105. In the second view, the small photodiode 115 is no longer directly under the apex of the MDML 105. Instead, the small photodiode 115 is positioned within the pixel 420 to be closer to the center of the array. In this configuration, the chief ray angle of the light from a scene 130 is directed onto the small photodiode 115.

Still referring to FIG. 4, a third pixel location 415 is closer to the corner boundary of the image sensor array of pixels

200. There are two views of the pixel 425 in the third pixel location 415. The first view is from directly above, and illustrates the location of the small photodiode 115 in relation to the large photodiode 116. In this embodiment, the smaller photodiode 115 may still be substantially enclosed by the larger photodiode 116, and may also be positioned so that the chief ray angle of light is directed to the smaller photodiode 115. In this view the smaller photodiode 115 is in the upper left corner of the pixel. The second view is a cut-away view of the pixel 425 illustrating the relation of the small photodiode 115 to the apex of the spherical convex surface of the MDML 105. In the second view, the small photodiode 115 is no longer directly under the apex of the MDML 105. Instead, the small photodiode 115 is positioned within the pixel 425 to be closer to the center of the array. In this configuration, the chief ray angle of the light from a scene 130 is directed onto the small photodiode 115.

Figure 5:
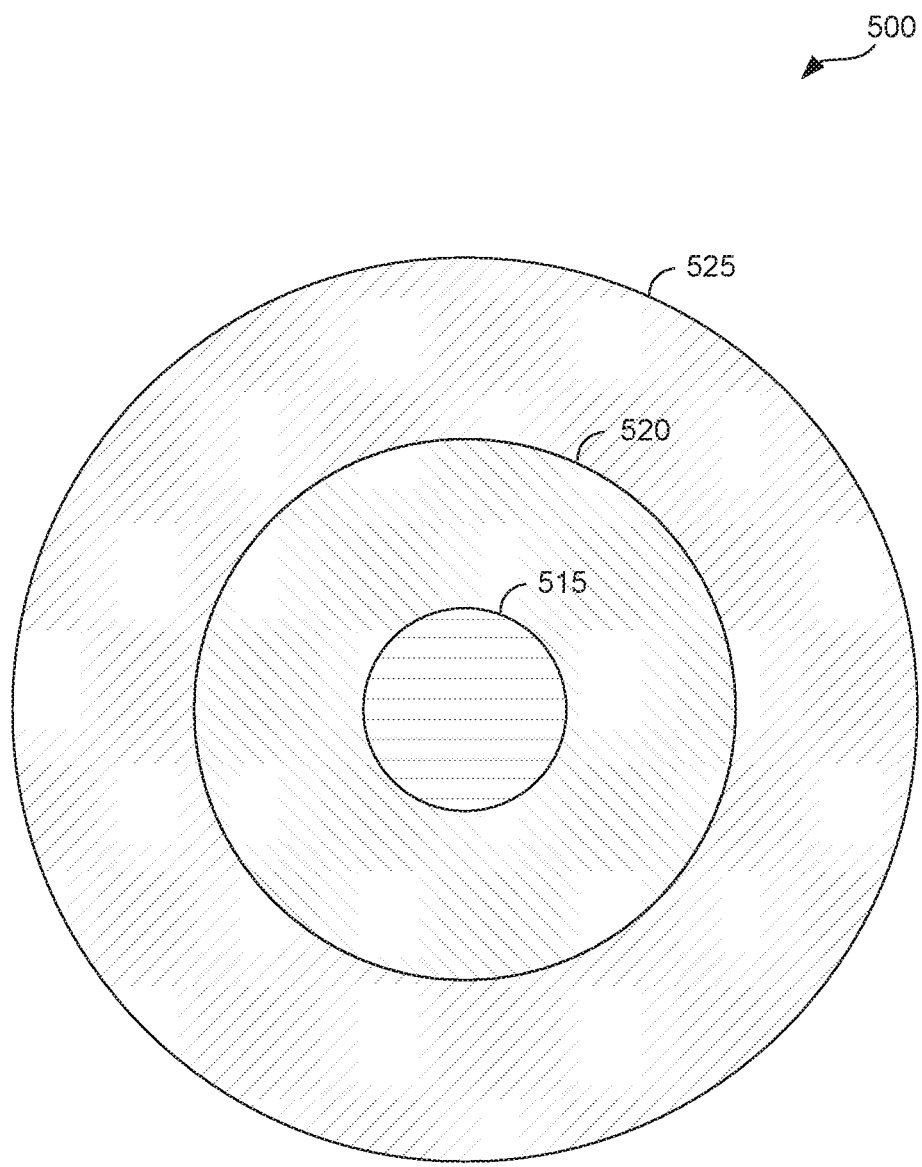
FIG. 5 illustrates a multi-diode pixel that includes three light sensing surfaces.

FIG. 5 illustrates an example embodiment of a pixel 500 including multiple light sensing surfaces. In this example, the pixel includes three light sensing surfaces. A first light sensitive surface 515 may be located in the center of the pixel, and may be substantially enclosed by a second light sensitive surface 520. The second light sensitive surface 520 may be substantially enclosed by a third light sensitive surface 525. The term "substantially" as used here indicates a tolerance within 10% of the position expressed. In another embodiment, each pixel may include any number of photodiodes in varying sizes that are arranged to allow aperture simulation.

Figure 6:
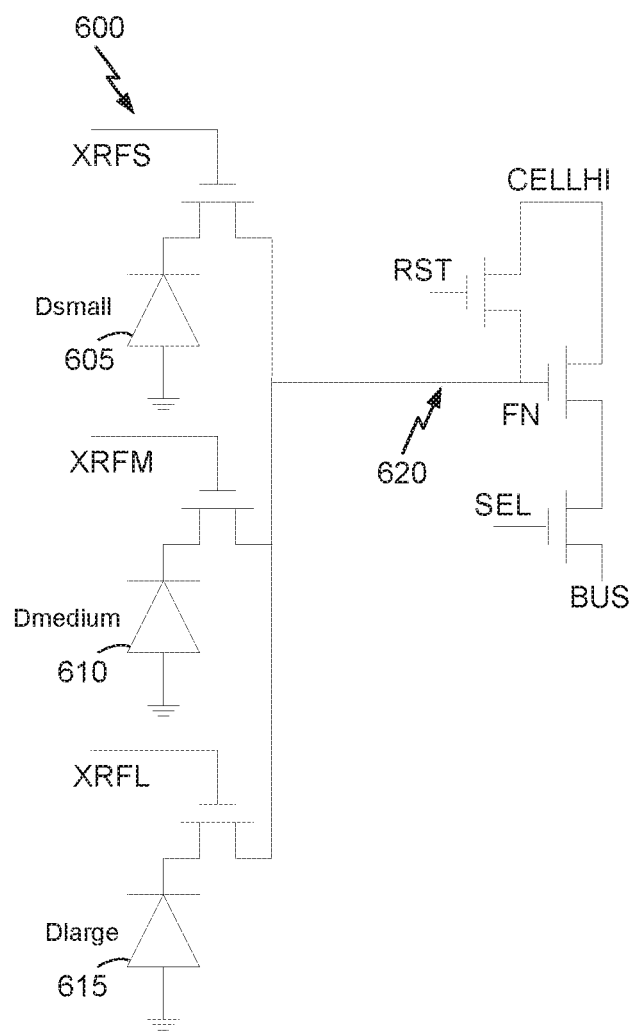
FIG. 6 illustrates an exemplary schematic diagram for a three-diode pixel that can combine the energy collected from the small photodiode with the energy collected from the medium diode and the energy collected from the large diode.

FIG. 6 illustrates an example pixel circuit including a set of three photodiodes 600. The first diode, Dsmall 605 may be related to the first light sensitive surface 515 of FIG. 5. The second diode, Dmedium 610 may be related to the second light sensitive surface 520 of FIG. 5. The third diode, Dlarge 615 may be related to the third light sensitive surface 525 of FIG. 5. The three photodiodes 600 can share one set of common transistors 620 for row/column select, reset, and floating node as shown in FIG. 6. Depending on the sharing architecture, operation timing can be adjusted accordingly.

Under the mode of operation illustrated in FIG. 3B, the three photodiodes 600 may be reset simultaneously at time $T_0$ by setting RST, XRFL, transfer field medium (XRFM), and XRFS to a high state. After that, the three photodiodes 600 begin accumulating photo-electrons. After a desired exposure time, the FN is reset by setting RST high. Following this, SEL may turn on to read out the reset level of the FN. After this, XRFL, XRFM, and XRFS may be sequentially set high, and the accumulated charges from the three photodiodes 600 may be transferred to FN in sequential order, followed by one readout of the FN level for each photodiode. This operation uses three readouts, one for each photodiode, so that the so that the signals of each of the three photodiodes 600 can be mixed by an analog signal mixer. Thus, this process may result in: (1) a method for processing multiple images, one image per photodiode, (2) an enhanced bokeh effect by combining the signals of two or more of the three photodiodes 600, and (3) noise reduction using Dlarge 615 by applying a per-pixel combination algorithm that combines the large aperture light collection and the small aperture sharpness.

In another embodiment, the three photodiodes 600 may be reset simultaneously at time T0 by setting RST, XRFL, XRFM, and XRFS to a high state. After that, the three photodiodes 600 begin accumulating photo-electrons. After a desired exposure time, the FN is reset by setting RST high. Following this, SEL may turn on to read out the reset level of the FN. After this, XRFL, XRFM, and XRFS may be set high and accumulated charges from the three photodiodes 600 may be transferred to FN, followed by one more readout of the FN level. This operation allows the use of only one readout, which minimizing noise contributions from the readout process while charges from the three photodiodes are added up to boost signal level. Thus, this process may result in a high signal-to-noise ratio.

Figure 7A:
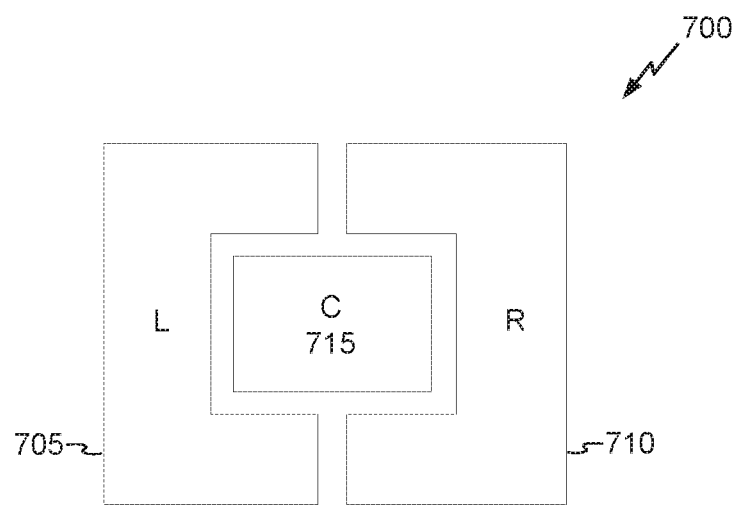
FIG. 7A illustrates an exemplary configuration of three light sensitive surfaces of a multi-diode pixel.
Figure 7B:
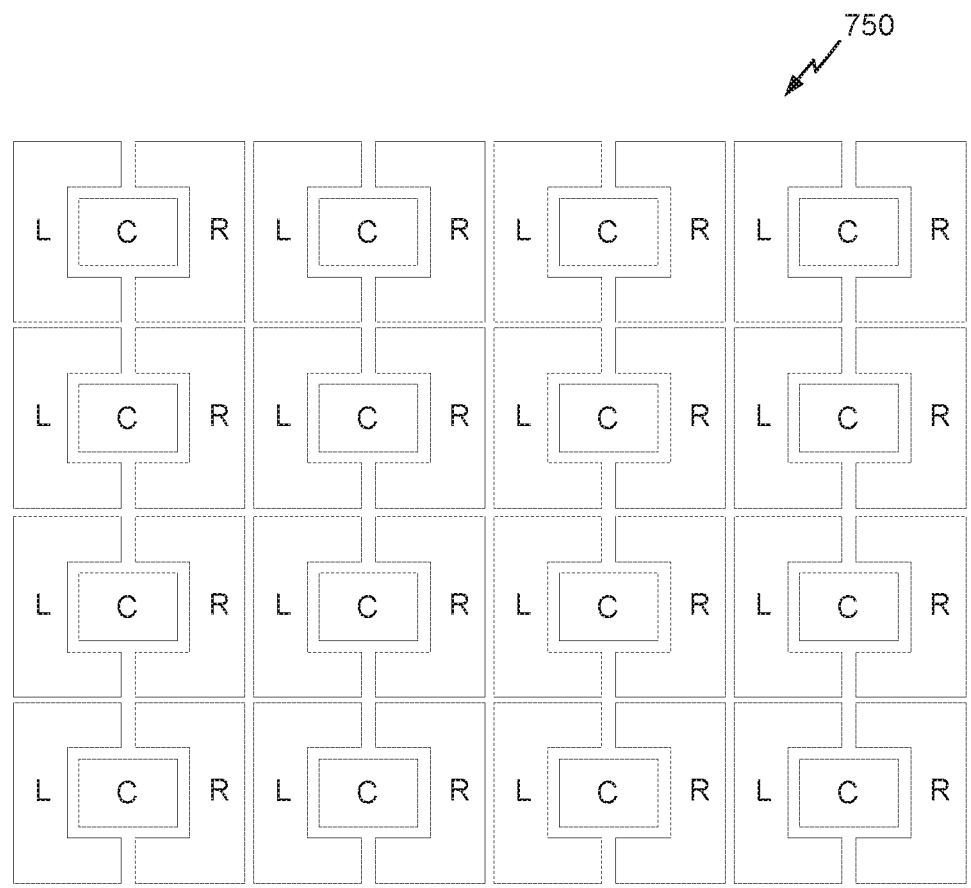
FIG. 7B illustrates an exemplary array of multi-diode pixels that include three light sensitive surfaces for combining aperture simulation with phase detection auto focus.

FIG. 7A illustrates an example embodiment of a pixel 700 having three light sensitive surfaces 705, 710, 715. In related aspects, a center light sensitive surface 715 may be a circular or rounded shape, and at least partially surrounded by two additional light sensitive surfaces 705, 710. It is noted that while the square shape of the center light sensitive surface 715 (e.g., in the FIG. 7A) may be used, other shapes may be included. In other aspects, a left light sensing surface 705 may be located to the left of the center light sensitive surface 715 and may substantially surround half of the center surface from the left side of the pixel 700. A right light sensing surface 710 may be located to the right of the center light sensitive surface 715 and may substantially surround half of the center surface from the right side of the pixel 700. The pixel 700 as illustrated in FIG. 7A may include light sensing surfaces that are rounded and not necessarily the rectangular form depicted. FIG. 7B illustrates an example array of pixels 750, where each pixel is of the configuration shown in FIG. 7A. The term "substantially" as used here indicates a tolerance within 10% of the position expressed.

Still referring to FIGS. 7A-7B, the left light sensitive surface 705 and the right light sensitive surface 710 of the three-diode pixel may include phase detection diodes. In this example arrangement, light travels from the scene 130, through a lens 125 for focusing the target scene 130 onto pixel that includes the phase detection diodes. The left light sensitive surface 705 receives light from a left direction L(i) of the lens 125 and the right light sensitive surface 710 receives light from a right direction R(i) of the lens 125. In some embodiments, light from the left direction L(i) can be light from a left half L(x) of the scene 130 and light from the right direction R(i) can be light from a right half (R(x)) of the scene 130. Accordingly, a number of phase detection diodes interleaved with imaging diodes across the image sensor can be used to extract left and right images that are offset from a center image captured by the imaging diodes. Rather than right and left, other embodiments can use up and down images, diagonal images, or a combination of left/right, up/down, and diagonal images for calculating autofocus adjustments. The phase detection diodes may further be used to calculate auto-focus lens positions and to generate a depth map showing a distance of a pixel with respect to the focus point of the main lens system.

When the image is in focus, the left rays L(i) and right rays R(i) converge at the plane (or surface) of the phase detection diodes. As described above, signals from the phase detection diodes can be used to generate left and right images that are offset from the center image in front or back defocus positions, and the offset amount can be used to determine an autofocus adjustment for the camera lens 125. The lens 125 can be moved forward (toward the image sensor) or backward (away from the image sensor) depending on whether the focal point is in front of the subject (closer to the image sensor), or behind the subject (farther away from the image sensor). Because the autofocus process can figure out both the direction and amount of movement for lens 125, phase-difference autofocus can focus very quickly.

To perform phase detection, the imaging system can save two images containing only values received from the phase detection diodes. The left light sensitive surface 705 may receive light entering a MDML 105 from the left side direction and the right light sensitive surface 710 may receive light entering the same MDML 105 from the right side direction. The MDML 105 may substantially overlay each pixel 700. Any number of MDML 105 can be disposed over an image sensor ranging from one to all of the MDMLs 105 of the sensor, based on balancing the considerations of more MDMLs 105 providing more reliable phase detection autofocus data but requiring greater amounts of computation for pixel value calculations and also increasing the likelihood of artifacts in a final image.

Focus can be calculated by applying a cross-correlation function to the data representing the left and right images. If the distance between the two images is narrower than the corresponding distance in an in-focus condition, the autofocus system determines that the focal point is in front of the subject. If the distance is wider than the reference value, the system determines that the focal point is behind the subject. The autofocus system can compute how much the lens 125 position (or sensor position, in embodiments having a movable sensor) should be moved and in which direction and provide this information to the lens 125 actuator to move the lens 125 accordingly, providing for fast focusing. The above-described process can be performed by an image signal processor.

Figure 8A:
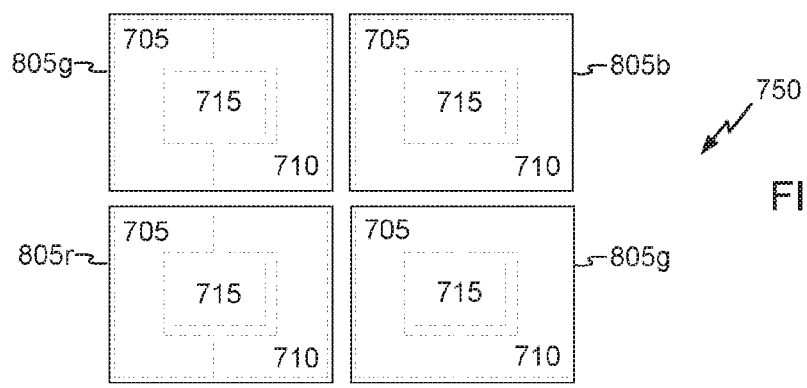
FIGS. 8A-8D are illustrations of a Bayer color filter pattern over a 2×2 array of multi-diode pixels.

FIGS. 8A-8D illustrate example CFA configurations for the pixel illustrated in FIGS. 7A-7B. However, while FIGS. 8A-8D may correspond to the pixel illustrated in FIGS. 7A-7B, it should be noted the one of ordinary skill in the art would be capable of applying the same or similar variations of color filter patterns to any other pixel and photodiode configuration described herein. As illustrated, a number of green color filters 805*g*, 810*g*, red color filters 805*r*, 810*r*, and blue color filters 805*b*, 810*b* may be arranged in the Bayer pattern under a number of MDMLs 105. FIG. 8A illustrates an example array of pixels 750 that includes four pixels in a square pattern, where each pixel includes three light sensitive surfaces outlined in a dashed line. Each of the pixels is surrounded by a solid line representing an individual color filter. In one embodiment, the CFA may be arranged similar to that of a Bayer color filter pattern. For example, the pixel in the top left corner of the array of pixels 750 may include a green color filter 805*g* that substantially covers the three light sensitive surfaces of the pixel, so that the three light sensitive surfaces are exposed to light filtered through a green filter 805*g*. The pixel in the top right corner of the array of pixels 750 may include a blue color filter 805*b* that substantially covers the three light sensitive surfaces of the pixel, so that the three light sensitive surfaces are exposed to light filtered through a blue filter 805*b*. The pixel in the bottom left corner of the array of pixels 750 may include a red color filter 805*r* that substantially covers the three light sensitive surfaces of the pixel, so that the three light sensitive surfaces are exposed to light filtered through a red filter 805*r*. The pixel in the bottom right corner of the array of pixels 750 may include a green color filter 805*g* that substantially covers the three light sensitive surfaces of the pixel, so that the three light sensitive surfaces are exposed to light filtered through a green filter 805*g*.

Figure 8B:
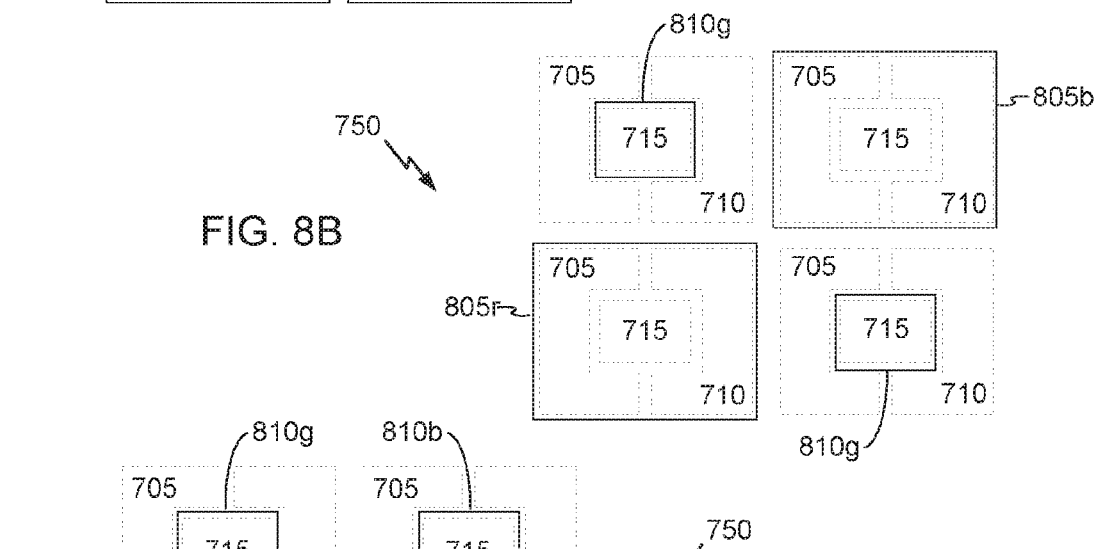

FIG. 8B illustrates another embodiment of the CFA in which some of the pixels are partially filtered. For example, the pixels in the top left corner and the bottom right corner of the array of pixels 750 may include a green color filter 810*g* that substantially covers the center light sensitive surface 715, but does not cover the left light sensitive surface 705 or the right light sensitive surface 710 of the pixels. The pixel in the top right corner of the array of pixels 750 may include a blue color filter 805*b* that substantially covers the three light sensitive surfaces of the pixel, so that the three light sensitive surfaces are exposed to light filtered through a blue filter 805*b*. The pixel in the bottom left corner of the array of pixels 750 may include a red color filter 805*r* that substantially covers the three light sensitive surfaces of the pixel, so that the three light sensitive surfaces are exposed to light filtered through a red filter 805*r*.

Figure 8C:
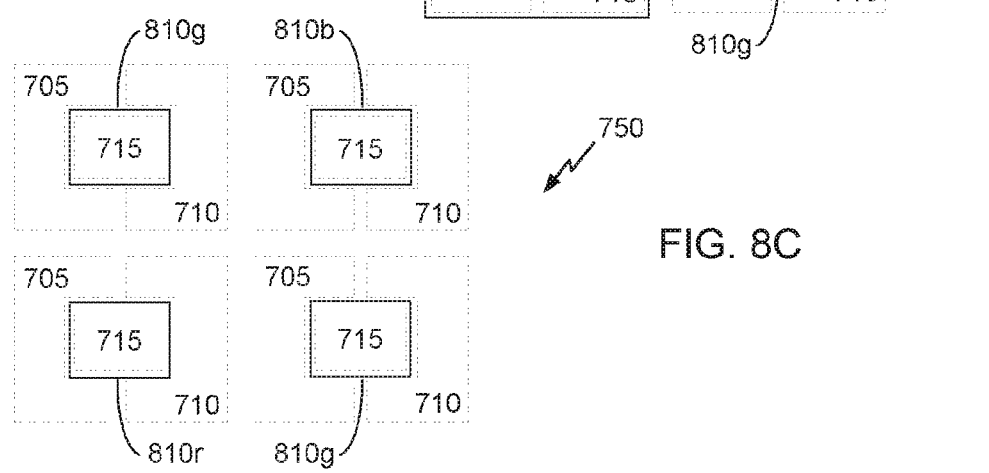

FIG. 8C illustrates another embodiment of the CFA in which the center light sensitive surface 715 of each pixel is covered by a color filter, while the left light sensitive surface 705 and the right light sensitive surface 710 have no filters. For example, the pixels in the top left corner and the bottom right corner of the array of pixels 750 may include a green color filter 810*g* that substantially covers the center light sensitive surface 715, but does not cover the left light sensitive surface 705 or the right light sensitive surface 710 of the pixels. The pixel in the top right corner of the array of pixels 750 may include a blue color filter 810*b* that substantially covers only the center light sensitive surface 715, so that the center light sensitive surface 715 is exposed to light filtered through a blue filter 810*b*. The pixel in the bottom left corner of the array of pixels 750 may include a red color filter 810*r* that substantially covers the center light sensitive surface 715 of the pixel 700, so that the center light sensitive surface 715 is exposed to light filtered through a red filter 810*r*.

Figure 8D:
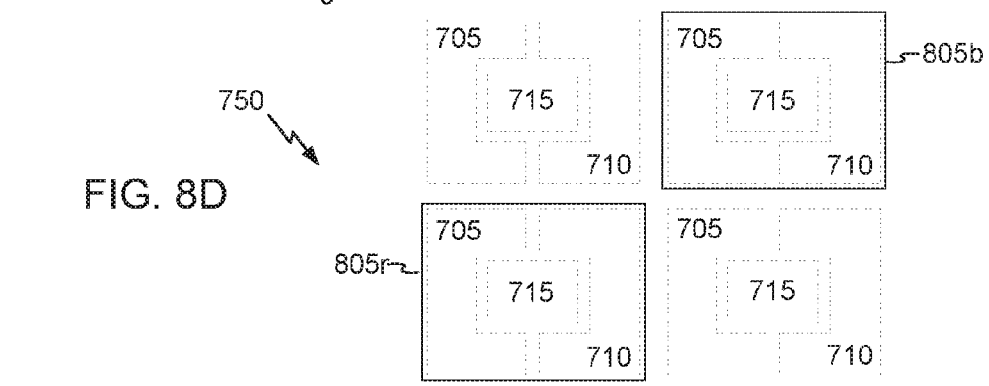

FIG. 8D illustrates a another embodiment of the CFA in which some of the pixels are completely filtered. For example, the pixel in the top right corner of the array of pixels 750 may include a blue color filter 805*b* that substantially covers the three light sensitive surfaces of the pixel, so that the three light sensitive surfaces are exposed to light filtered through a blue filter 805*b*. The pixel in the bottom left corner of the array of pixels 750 may include a red color filter 805*r* that substantially covers the three light sensitive surfaces of the pixel, so that the three light sensitive surfaces are exposed to light filtered through a red filter 805*r*. The pixels in the top left corner and the bottom right corner of the array do not include a filter that overlays the light sensitive surfaces.

Methods and Architectures for Aperture Simulation

Figure 9A:
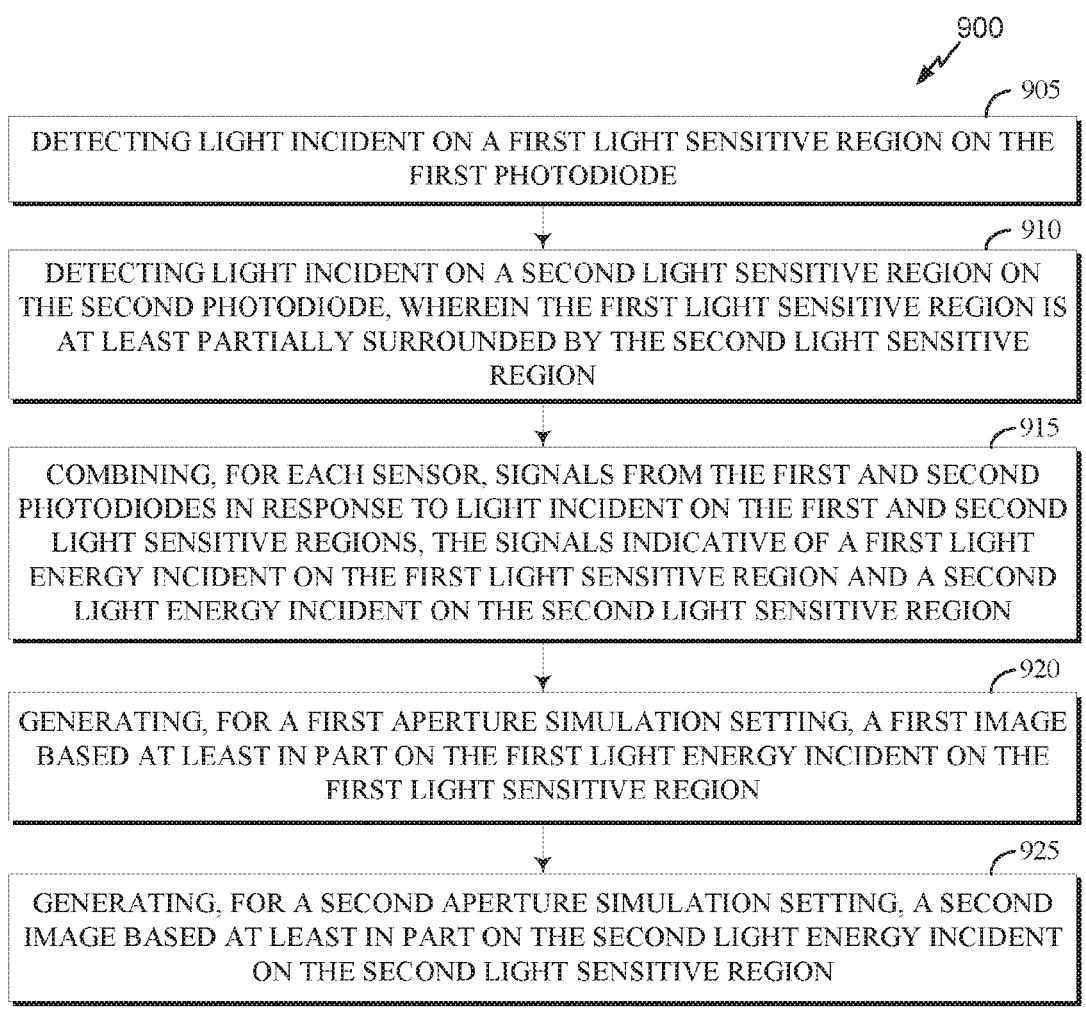
FIGS. 9A-9B illustrate methods for using a simulated aperture apparatus.

FIG. 9A is a flow chart 900 illustrating an example of a method (or process) for aperture simulation using an image sensor that includes a plurality of pixels, where each pixel includes two light sensing surfaces. In block 905, each pixel of the image sensor detects light incident on a first light sensitive region of the small photodiode 115. The image sensor may include a plurality of pixels, where each pixel includes a small photodiode 115 that contains a first light sensitive region. The small photodiode 115 may include a first charge storage element (CSE) for storing the energy generated by the light incident on the first light sensing region. In block 910, each pixel of the image sensor detects light incident on a second light sensitive region of the large photodiode 116. The large photodiode 116 may include a second CSE for storing energy generated by the light incident on the second light sensing region. In one embodiment, the first light sensitive region is at least partially surrounded by the second light sensitive region. In another embodiment, the first light sensitive region may be smaller than the second light sensitive region.

Still referring to FIG. 9A, in block 910, each pixel of the image sensor may detect light incident on a second light sensitive region on the large photodiode 116, wherein the first light sensitive region is at least partially surrounded by the second light sensitive region. In block 915, the analog signal mixer 205 may combine, for each pixel, signals from the first and large photodiodes 116 in response to light incident on the first and second light sensitive regions, the signals indicative of a first light energy incident on the first light sensitive region and a second light energy incident on the second light sensitive region. Simulated aperture may be controlled by mixing the signals from the small photodiode 115 and large photodiodes 116. In one embodiment, the signals may be mixed using equation (1):

$$(E_s+E_b)\cdot(a_0)+E_s\cdot(1-a_0) \qquad (1)$$

Where:
- $E_s$: first light energy incident on the first light sensitive region,
- $E_b$: second light energy incident on the second light sensitive region,
- $a_0$: a configurable register value being between zero and one.

As is apparent by one skilled in the art, an image may be based on the summation of the small photodiode 115 and large photodiodes 116, but may also be based only on the small photodiode 115 (or center diode). In another embodiment, the image may be based on only the second light energy ($E_b$).

Still referring to FIG. 9A, in block 920, an image signal processor may generate, for a first aperture simulation setting, a first image based at least in part on the first light energy incident on the first light sensitive region. In block 925, an image signal processor may generate, for a second aperture simulation setting, a second image based at least in part on the second light energy incident on the second light sensitive region.

Figure 9B:
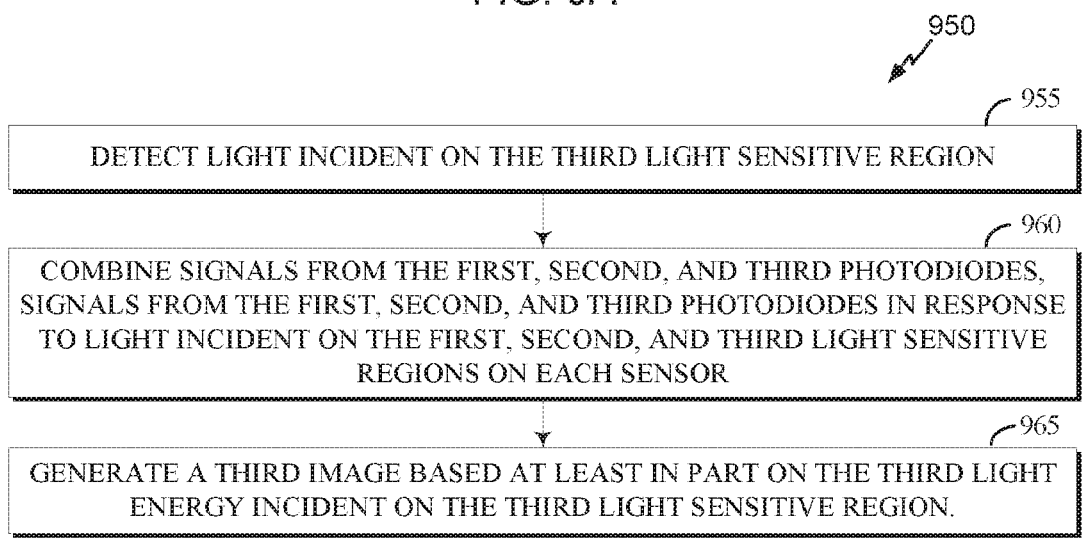

FIG. 9B is a flow chart 950 illustrating an example of a method (or process) for aperture simulation using an image sensor that includes pixels, where each pixel includes three light sensing surfaces. The process illustrated in FIG. 9B may be used in conjunction with the process illustrated in FIG. 9A. In block 955, each pixel of the image sensor may detect light incident on a third light sensitive region. The third light sensitive region may be in addition to the first and second light sensitive regions, and may reside on the same pixel.

Still referring to FIG. 9B, in block 960, each pixel of the image sensor may combine signals from the first, second, and third photodiodes, signals from the first, second, and third photodiodes in response to light incident on the first, second, and third light sensitive regions on each pixel. Simulated aperture may be controlled by mixing the signals from the first and second photodiodes. In one embodiment, the signals may be mixed using equation (2):

$$(E_s)\cdot(a_0)+(E_s+E_m)\cdot(a_1)+(E_s+E_m+E_b)\cdot(a_2) \qquad (2)$$

Where:
- $E_s$: first light energy incident on the first light sensitive region,
- $E_b$: second light energy incident on the second light sensitive region,
- $a_0$: a first configurable register value being between zero and one,
- $a_1$: a second configurable register value being between zero and one,
- $a_2$: a third configurable register value being between zero and one.

The configurable registers, $a_0$, $a_1$, and $a_2$ may each refer to a unique number.

For example, in equation (2), when $a_0$ is set to a value of one and the other register values are set to a value of zero, there can be no signal mixing, and the image may be based on the energy collected from the center light sensitive surface 715. This may result in an image with the foreground and background in focus. In another embodiment, the processor may set the register value automatically based on a determination of the distance of the scene using phase detection auto-focus. For example, when a close object is detected, the register value may be set at or close to a value of zero in order to create a large DOF. In this example, each pixel 700 of the array of pixels 750 may be individually controlled by a processor. For example, the signal mixer 205 may be configured to collect energy created based on light incident on only one of any of the three light sensitive surfaces 705, 710, 715 of the pixel 700. This may result in processing a left, right, and center image. Using the phase detection, the pixels that captured the object determined to be close may use a combination of the energy collected on the three light sensitive surfaces 705, 710, 715, while the pixels that captured the image surrounding the object determined to be close may use only the light collected from the center light sensitive surface 715, or a combination of the light from all three light sensitive surfaces 705, 710, 715 with a higher level of energy being used from the center light sensitive surface 715 (e.g., $a_0=0.9$, $a_1=0.05$, and $a_2=0.05$).

The configurable register values may also be set to a value depending on an auto-exposure algorithm decision. For example, the ISP or SoC may determine that a bright scene may require a relatively short exposure time. In such a case, the configurable register values may be set so that when an image of the scene is captured, a greater amount of analog signals from each diode are combined. In another embodiment, the configurable register values may be adjusted according to a manual user setting. In this configuration, the user may manually select an aperture value (e.g., F22), the aperture value associated with a set of register values. In another embodiment, the configurable register values may be set to vary the DOF according to a distance, using a hyper focal lens design. In this configuration, a simulation of a small aperture (e.g., $a_0=0.9$, $a_1=0.05$, and $a_2=0.05$) may be used when the subject of the scene is not in focus, or when certain pixels within the scene are not in focus, or both. Such a configuration eliminates the need for an auto-focus motor and any associated lens structure.

In another embodiment, a first image may be captured by the left light sensing surface 705, and a second image may be captured by the right light sensing surface 710. A phase detection algorithm may compare the first and second images and determine an amount of blur in the compared images. For example, a focus point in the two images will appear sharp when the two images are compared, but objects in front or behind the focus point will be out of phase, and will have a degree of blurring. The processor may determine a disparity value according to the degree of blurring. For example, objects in the foreground of the focus point may indicate a negative disparity value, while objects in the background may indicate a positive disparity value. A noise reduction algorithm may perform a pixel-by-pixel analysis on the values of the center pixel in contrast with the values surrounding it. The algorithm may blur the noise of the center pixel based on the surround pixel values. In regions of the image that include high disparity values, the blurring of pixel noise may be increased to create a more dramatic bokeh effect. This can be done by incorporating more energy absorbed by the larger photodiodes of the pixels in these regions. In regions of the image that include low disparity values, it may be advantageous to achieve a sharper image by favoring the light obtained by the center photodiode 715 over the surrounding diodes (705, 710) of each pixels in the region.

Still referring to FIG. 9B, in block 965, the processor may generate a third image based at least in part on the third light energy incident on the third light sensitive region. The third image may include energy created based on light incident on all of the three light sensitive surfaces 705, 710, 715 of the pixel 700. The register values of equations 1 and 2 may be set manually by a user of the device.

Figure 10:
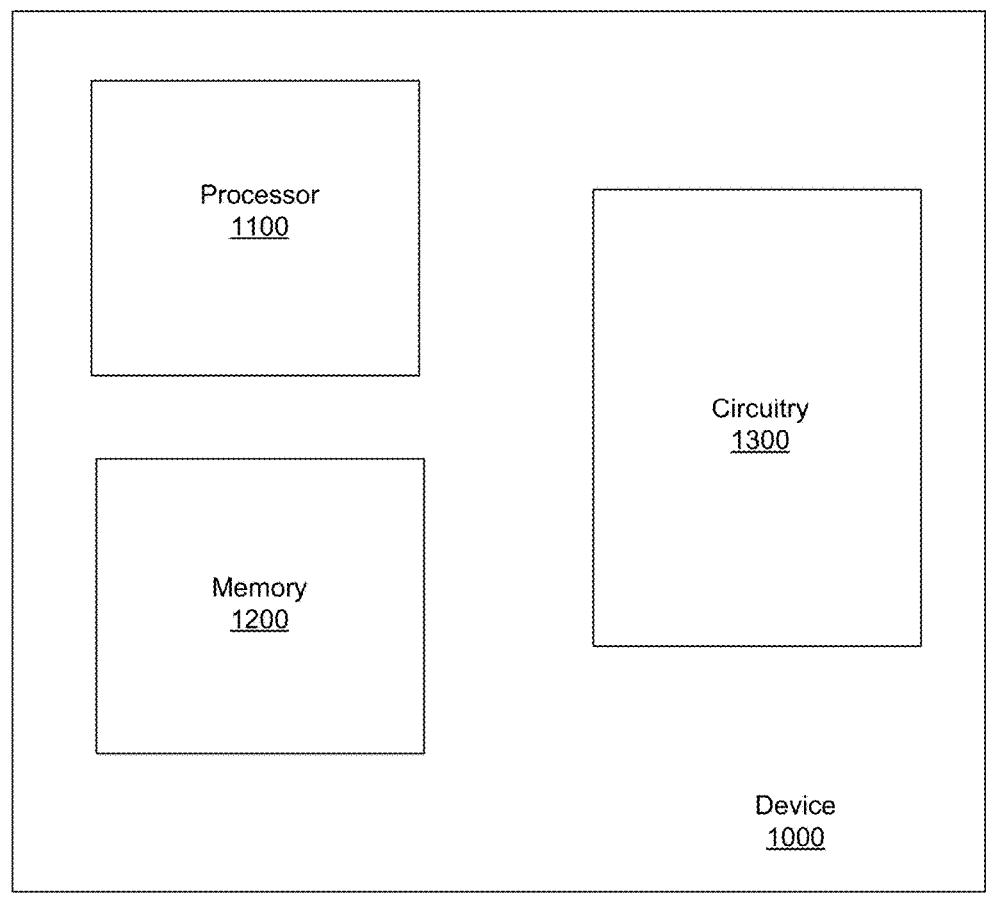
FIG. 10 illustrates an example device or apparatus (e.g., a mobile device) in accordance with the aspects of the present application.

FIG. 10 shows an example device 1000 in accordance with the aspects of the present application. The device 1000 may be an apparatus such as, for example, a mobile device, a camera phone, or a digital camera. The device 1000 may include a processor 1100 such as, for example, an ASIC, an ISP, or a logic circuit. The device 1000 may include a memory 1200 such as, for example, a non-transitory computer readable storage medium, ROM, RAM, EPROM, or EEPROM. The device 1000 may include a circuit 1300, which may include photodiodes, analog signal mixers, amplifiers, analog-to-digital converters, logic components, buffers, etc.

Implementing Systems and Terminology

One or more of the components, steps, features and/or functions illustrated in the figures may be rearranged and/or combined into a single component, step, feature or function or embodied in several components, steps, or functions. Additional elements, components, steps, and/or functions may also be added without departing from novel features disclosed herein. The apparatus, devices, and/or components illustrated in the figures may be configured to perform one or more of the methods, features, or steps described in the figures. The novel algorithms described herein may also be efficiently implemented in software and/or embedded in hardware.

Also, it is noted that the embodiments may be described as a process that is depicted as a flowchart, a flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed. A process may correspond to a method, a function, a procedure, a subroutine, a subprogram, etc. When a process corresponds to a function, its termination corresponds to a return of the function to the calling function or the main function.

The term "determining" encompasses a wide variety of actions and, therefore, "determining" can include calculating, computing, processing, deriving, investigating, looking up (e.g., looking up in a table, a database or another data structure), ascertaining and the like. Also, "determining" can include receiving (e.g., receiving information), accessing (e.g., accessing data in a memory) and the like. Also, "determining" can include resolving, selecting, choosing, establishing and the like.

The phrase "based on" does not mean "based only on," unless expressly specified otherwise. In other words, the phrase "based on" describes both "based only on" and "based at least on."

The term "photodiode" or "diode" may include multiple photosensitive elements, for example a photogate, photoconductor, or other photodetector, overlying a substrate for accumulating photo-generated charge in an underlying portion of the substrate.

Moreover, storage medium may represent one or more devices for storing data, including read-only memory (ROM), random access memory (RAM), magnetic disk storage mediums, optical storage mediums, flash memory devices and/or other machine-readable mediums, processor-readable mediums, and/or computer-readable mediums for storing information. The terms "machine-readable medium", "computer-readable medium", and/or "processor-readable medium" may include, but are not limited to non-transitory mediums such as portable or fixed storage devices, optical storage devices, and various other mediums capable of storing, containing or carrying instruction(s) and/or data. Thus, the various methods described herein may be fully or partially implemented by instructions and/or data that may be stored in a "machine-readable medium," "computer-readable medium," and/or "processor-readable medium" and executed by one or more processors, machines and/or devices.

Furthermore, embodiments may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

A person having ordinary skill in the art will appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system.

The various features of the invention described herein can be implemented in different systems without departing from the invention. It should be noted that the foregoing embodiments are merely examples and are not to be construed as limiting the invention. The description of the embodiments is intended to be illustrative, and not to limit the scope of the claims. As such, the present teachings can be readily applied to other types of apparatuses and many alternatives, modifications, and variations will be apparent to those skilled in the art.

What is claimed is:

1. A circuit configured for aperture simulation, comprising:
   an array of pixels, each pixel provided with a first photodiode of a first size and a second photodiode of a second size larger than the first size, wherein:
      the first photodiode is configured to detect light incident on the first photodiode for a first integration time and convert the detected light into a first voltage signal indicative of a first light energy incident on the first photodiode,
      the second photodiode is configured to detect light incident on the second photodiode for a second integration time and convert the detected light into a second voltage signal indicative of a second light energy incident on the second photodiode, wherein
      the first photodiode is at least partially surrounded by the second photodiode, and the second integration time is longer than the first integration time; and
   a signal mixer coupled to each pixel and configured to combine, for each pixel, the first and second voltage signals,
   wherein the circuit is configured to simulate aperture control based on: (i) a first aperture simulation setting of a first image based on the first light energy incident on the first photodiode; and (ii) a second aperture simulation setting of a second image based on the second light energy incident on the second photodiode.

2. The circuit of claim 1, wherein a second light sensitive region of the second photodiode is larger than a first light sensitive region of the first photodiode.

3. The circuit of claim 2, wherein the circuit is further configured to generate the second image based on a combination of the first light energy incident on the first light sensitive region and the second light energy incident on the second light sensitive region.

4. The circuit of claim 2, further comprising a third photodiode, the third photodiode, of a third size, comprising a third light sensitive region configured to detect light incident on the third light sensitive region, wherein the first light sensitive region is at least partially surrounded by the third light sensitive region, wherein the signal mixer is further configured to combine signals from (i) the first light sensitive region, (ii) the second light sensitive region, and (iii) the third light sensitive region, wherein signals from the first, second, and third photodiodes are in response to light incident on the first, second, and third light sensitive regions on each pixel, and wherein the circuit is further configured to generate a third image based at least in part on the signal from the third photodiode.

5. The circuit of claim 4, wherein the circuit is further configured to:
   compare the second image and the third image, the second image captured by the second light sensitive region, the third image captured by the third light sensitive region;
   determine a phase difference between the second image and the third image; and
   calculate a register value corresponding to the phase difference, wherein the signal mixer combines signals from (i) the first light sensitive region, (ii) the second light sensitive region, and (iii) the third light sensitive region based on the register value.

6. The circuit of claim 4, wherein
   the first light sensitive region is located in a central position relative to the second light sensitive region and the third light sensitive region on each pixel,
   the second light sensitive region is located in a position left of the first light sensitive region,
   the third light sensitive region is located in a position right of the first light sensitive region, and
   the second light sensitive region and the third light sensitive region at least partially surround the first light sensitive region.

7. The circuit of claim 1, further comprising a micro-lens array, the micro-lens array arranged relative to the array of pixels such that each pixel receives light propagating through at least one micro-lens.

8. The circuit of claim 7, wherein each micro-lens comprises one plane surface and one spherical convex surface, and wherein the first light sensitive region is arranged relative to the micro-lens such that a center of the first light sensitive region is vertically aligned with an apex of the spherical convex surface of the micro-lens.

9. A method of simulating an aperture with an array of pixels, each pixel provided with a first photodiode of a first size, and a second photodiode of a second size larger than the first size and no additional photodiode, the method comprising:
   detecting light incident on a first light sensitive region on the first photodiode for a first integration time and converting the detected light into a first voltage signal indicative of a first light energy incident on the first light sensitive region;
   detecting light incident on a second light sensitive region on the second photodiode for a second integration time longer than the first integration time, and converting the detected light into a second voltage signal indicative of a second light energy incident on the second light sensitive region, wherein the first light sensitive region is at least partially surrounded by the second light sensitive region;
   combining, for each pixel, the first and second voltage signals from the first and second photodiodes; and
   simulating aperture control based on a: (i) first aperture simulation setting of a first image based on the first light energy incident on the first light sensitive region; and (ii) a second aperture simulation setting of a second image based on the second light energy incident on the second light sensitive region.

10. The method of claim 9, wherein the second light sensitive region is larger than the first light sensitive region.

11. The method of claim 9, further comprising generating the second image based on a combination of the first light energy incident on the first light sensitive region and the second light energy incident on the second light sensitive region.

12. The method of claim 9, further comprising:
detecting light incident on a third light sensitive region on a third photodiode, of a third size larger than the second size, wherein the first light sensitive region is at least partially surrounded by the third light sensitive region;
combining signals from (i) the first light sensitive region, (ii) the second light sensitive region, and (iii) the third light sensitive region, wherein the signal from the third light sensitive region is in response to light incident on the third light sensitive region and is indicative of a third light energy incident on the third light sensitive region on each pixel; and
generating a third image based at least in part on the third light energy incident on the third light sensitive region.

13. The method of claim 12, wherein the third light sensitive region is larger than the first light sensitive region.

14. The method of claim 12, further comprising generating the third image based on a combination of the first light energy incident on the first light sensitive region, the second light energy incident on the second light sensitive region, and the third light incident on the third light sensitive region.

15. The method of claim 9, further comprising a micro-lens array, the micro-lens array arranged relative to the pixel array such that each pixel receives light propagating through at least one micro-lens.

16. A circuit configured for simulating an aperture with an array of pixels, the circuit comprising:
first means for detecting light incident on a first light sensitive region for a first integration time and converting the detected light into a first voltage signal indicative of a first light energy incident on the first light sensitive region, the first means being of a first size;
second means for detecting light incident on a second light sensitive region for a second integration time longer than the first integration time and converting the detected light into a second voltage signal indicative of a second light energy incident on the second light sensitive region, the second means being of a second size larger than the first size, wherein the first light sensitive region is at least partially surrounded by the second light sensitive region;
third means for combining, for each pixel, the first and second voltage signals; and
fourth means for simulating aperture control based on a: (i) first aperture simulation setting of a first image based on the first light energy incident on the first light sensitive region; and (ii) a second aperture simulation setting of a second image based on the second light energy incident on the second light sensitive region.

17. The circuit of claim 16, wherein:
the first means for detecting light incident on a first light sensitive region comprises a first photodiode;
the second means for detecting light incident on a second light sensitive region comprises a second photodiode; and
the third means for combining signals comprises an analog signal mixer.

18. The circuit of claim 16, wherein the second light sensitive region is larger than the first light sensitive region.

19. The circuit of claim 16, further comprising fifth means for generating the second image based on a combination of the first light energy incident on the first light sensitive region and the second light energy incident on the second light sensitive region.

20. The circuit of claim 16, further comprising:
fifth means for detecting light incident on a third light sensitive region, wherein the first light sensitive region is at least partially surrounded by the third light sensitive region; and
sixth means for combining signals from (i) the first light sensitive region, (ii) the second light sensitive region, and (ii) the third light sensitive region, wherein the signal from the third light sensitive region is in response to a third light energy incident on the third light sensitive region on each pixel.

21. The circuit of claim 20, wherein the third light sensitive region is larger than the first light sensitive region.

22. The circuit of claim 20, further comprising generating the third image based on a combination of the first light energy incident on the first light sensitive region, the second light energy incident on the second light sensitive region, and the third light energy incident on the third light sensitive region.

23. A mobile device, comprising:
an array of pixels, each pixel provided with:
a first photodiode of a first size, comprising a first light sensitive region configured to detect light incident on the first light sensitive region for a first integration time and convert the detected light into a first voltage signal indicative of a first light energy incident on the first light sensitive region; and
a second photodiode of a second size larger than the first size, comprising a second light sensitive region and configured to detect light incident on the second light sensitive region for a second integration time longer than the first integration time and convert the detected light into a second voltage signal indicative of a second light energy incident on the second light sensitive region, wherein the first light sensitive region is at least partially surrounded by the second light sensitive region;
a signal mixer coupled to each pixel and configured to combine, for each pixel, the first and second voltage signals; and
a processor configured to simulate aperture control based on a: (i) first aperture simulation setting of a first image based on the first light energy incident on the first light sensitive region; and (ii) a second aperture simulation setting of a second image based on the second light energy incident on the second light sensitive region.

24. The mobile device of claim 23, wherein the second light sensitive region is larger than the first light sensitive region.

25. The mobile device of claim 23, wherein the processor is further configured to:
generate the second image based on a combination of the first light energy incident on the first light sensitive region and the second light energy incident on the second light sensitive region.

26. The mobile device of claim 23, wherein generating the second image is based on a formula:

$$(E_s+E_b)\cdot(a_0)+E_s\cdot(1-a_0)$$

where $E_s$ is the first light energy incident on the first light sensitive region, $E_b$ is the second light energy incident on the second light sensitive region, and $a_0$ is a first configurable register value being between zero and one.

27. The mobile device of claim 23, wherein the processor is further configured to:
- detect light incident on a third photodiode, of a third size larger than the second size comprising a third light sensitive region, wherein the first light sensitive region is at least partially surrounded by the third light sensitive region;
- combine signals from (i) the first light sensitive region, (ii) the second light sensitive region, and (iii) the third light sensitive region, wherein the signal from the third light sensitive region is in response to light incident on the third light sensitive region and is indicative of a third light energy incident on the third light sensitive region on each pixel; and
- generate a third image based at least in part on the third light energy incident on the third light sensitive region.

28. The mobile device of claim 27, wherein the third light sensitive region is larger than the first light sensitive region.

29. The mobile device of claim 27, wherein the processor is further configured to:
generate the third image based on a combination of the first light energy incident on the first light sensitive region, the second light energy incident on the second light sensitive region, and the third light energy incident on the third light sensitive region.

30. The mobile device of claim 27, wherein generating the third image is based on a formula:

$$(E_s) \cdot (a_0) + (E_s + E_m) \cdot (a_1) + (E_s + E_m + E_b) \cdot (a_2)$$

where $E_s$ is the first light energy incident on the first light sensitive region, $E_b$ is the second light energy incident on the second light sensitive region, $E_m$ is the third light energy incident on the third light sensitive region, and $a_0$ is a first configurable register value being between zero and one, $a_1$ is a second configurable register value being between zero and one, and $a_2$ is a third configurable register value between zero and one.

* * * * *